United States Patent
Kurita et al.

(10) Patent No.: US 11,966,606 B2
(45) Date of Patent: Apr. 23, 2024

(54) MEMORY SYSTEM AND METHOD

(71) Applicant: Kioxia Corporation, Tokyo (JP)

(72) Inventors: Takahiro Kurita, Sagamihara Kanagawa (JP); Shinichi Kanno, Ota Tokyo (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/691,938

(22) Filed: Mar. 10, 2022

(65) Prior Publication Data

US 2023/0075796 A1 Mar. 9, 2023

(30) Foreign Application Priority Data

Sep. 9, 2021 (JP) .................................. 2021-146543

(51) Int. Cl.
*G06F 3/06* (2006.01)
(52) U.S. Cl.
CPC ............ *G06F 3/064* (2013.01); *G06F 3/0607* (2013.01); *G06F 3/0688* (2013.01)
(58) Field of Classification Search
None
See application file for complete search history.

(56) References Cited

U.S. PATENT DOCUMENTS

| | | | |
|---|---|---|---|
| 2012/0079167 A1* | 3/2012 | Yao | G06F 3/0641 |
| | | | 711/E12.008 |
| 2017/0262212 A1 | 9/2017 | Nakanishi et al. | |
| 2019/0146705 A1* | 5/2019 | Lin | G06F 3/0659 |
| | | | 711/103 |
| 2019/0294358 A1 | 9/2019 | Suzuki et al. | |
| 2021/0034541 A1 | 2/2021 | Maeda | |
| 2021/0141553 A1* | 5/2021 | Yoo | G06F 3/0619 |
| 2021/0149592 A1* | 5/2021 | Papandreou | G06F 9/5033 |
| 2021/0334211 A1* | 10/2021 | Duan | G11C 11/5628 |
| 2021/0365367 A1* | 11/2021 | Kim | G06F 3/064 |
| 2022/0075551 A1* | 3/2022 | Alhussien | G06F 3/0679 |

FOREIGN PATENT DOCUMENTS

| | | |
|---|---|---|
| JP | 2019-168937 A | 10/2019 |
| JP | 2021-026448 A | 2/2021 |

* cited by examiner

*Primary Examiner* — Stephanie Wu
(74) *Attorney, Agent, or Firm* — Maier & Maier, PLLC

(57) ABSTRACT

A memory system includes a controller and a flash memory including a plurality of first blocks. The controller writes a value having a first number of bits per memory cell to a plurality of second blocks, and writes a value having a second number of bits per memory cell to a plurality of third blocks among the first blocks. The second number is more than the first number. The controller writes data from a host device to the second blocks and transcribes valid data from the second blocks to the third blocks. The controller controls the number of second blocks in the first blocks according to an order of completion of the data writing to one or more third blocks and an amount of valid data stored in each of the one or more third blocks.

10 Claims, 13 Drawing Sheets

MEMORY SYSTEM AND METHOD

CROSS-REFERENCE TO RELATED APPLICATIONS

This application is based upon and claims the benefit of priority from Japanese Patent Application No. 2021-146543, filed on Sep. 9, 2021; the entire contents of which are incorporated herein by reference.

FIELD

Embodiments described herein relate generally to a memory system and a method.

BACKGROUND

Traditionally, memory systems in which the number of bits in a value to be written per memory cell is variable have been known.

DETAILED DESCRIPTION

According to one embodiment, in general, a memory system is connectable to a host device. The memory system includes a flash memory including a plurality of first blocks and a controller. The plurality of first blocks each includes a plurality of memory cells and data is writable to the first blocks in either of a first mode and a second mode. The first mode is a mode in which a value having a first number of bits is written per memory cell. The second mode is a mode in which a value having a second number of bits is written per memory cell. The second number is more than the first number. The controller is configured to use a plurality of second blocks being part of the plurality of first blocks in the first mode, and use a plurality of third blocks being another part of the plurality of first blocks in the second mode. The controller sequentially writes data from the host device to the plurality of second blocks, and executes a first transcription process and a second transcription process. The first transcription process includes selecting one second block from one or more second blocks in which data writing is completed among the plurality of second blocks, and placing the one second block into a reusable state by sequentially writing valid data from the one second block to the plurality of third blocks. The second transcription process includes selecting one third block from one or more third blocks in which data writing is completed among the plurality of third blocks, and placing the one third block into a reusable state by writing valid data from the one third block to a third block in which data writing is not completed. The controller controls a number of the second blocks in the plurality of first blocks according to an order of completion of the data writing to the one or more third blocks and an amount of valid data stored in each of the one or more third blocks.

Hereinafter, a memory system and a method according to some embodiments will be described in detail with reference to the accompanying drawings. Note that the embodiments are presented for illustrative purpose only and not intended to limit the scope of the present invention.

First Embodiment

Figure 1:
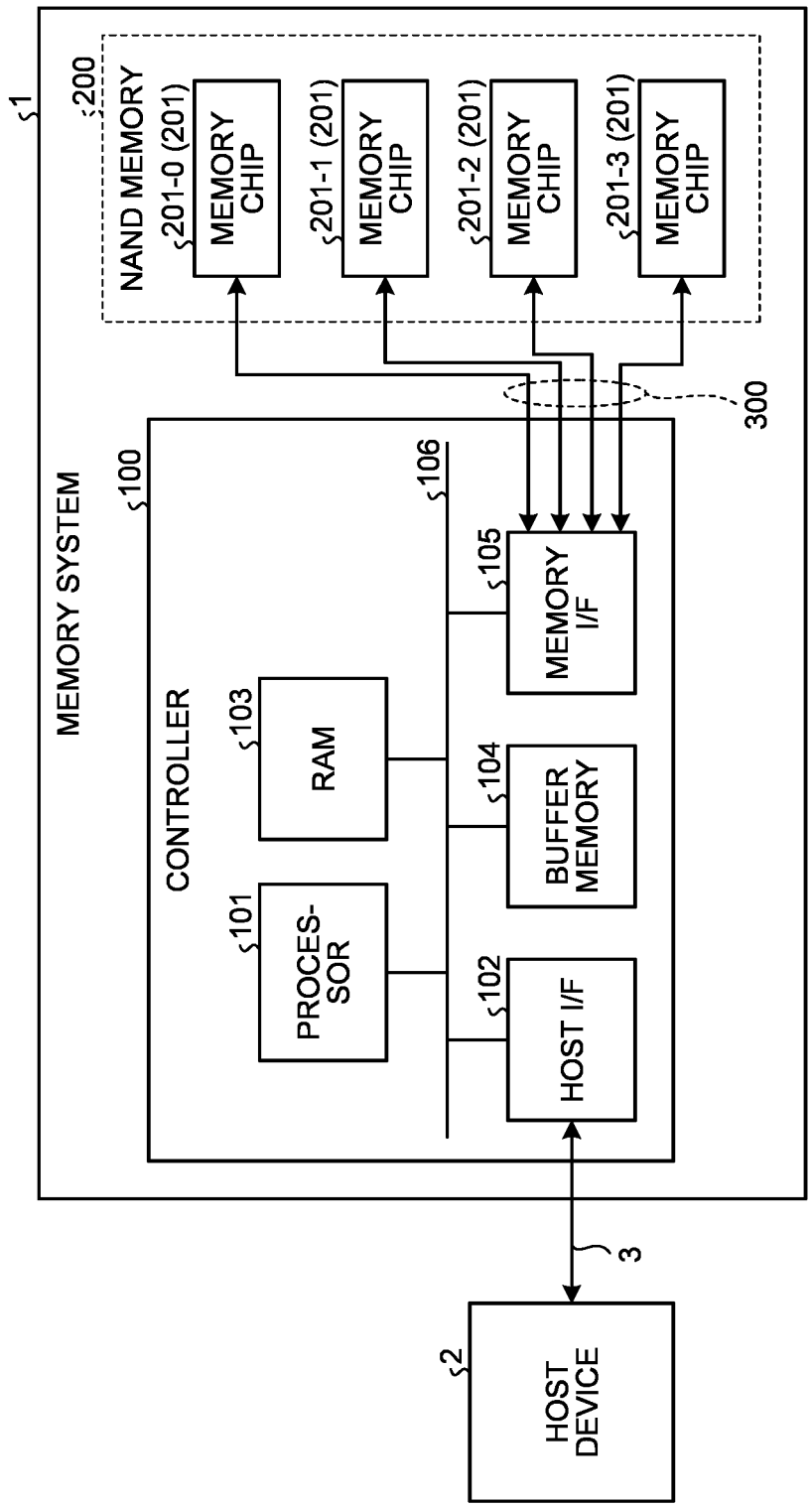
FIG. 1 is a schematic diagram illustrating an exemplary configuration of a memory system according to a first embodiment.

FIG. 1 is a schematic diagram illustrating an exemplary configuration of a memory system 1 according to a first embodiment.

The memory system 1 is connected to a host device 2 via a communication interface 3. The host device 2 is a processor included in an information processing device. The information processing device is exemplified by a computer such as a laptop personal computer, a mobile phone, a smartphone, a portable music player, or an imaging device. Examples of the memory system 1 includes a solid state drive (SSD). The standard of the communication interface 3 is not limited to a particular standard.

The memory system 1 serves to receive access commands, e.g., write commands or read commands, from the host device 2. The memory system 1 stores requested user data in accordance with a write command. The memory system 1 transmits requested user data to the host device 2 in accordance with a read command.

The access command includes a logical address. The memory system 1 provides a logical address space to the host device 2. The logical address indicates a location in the address space. The host device 2 designates a write location or a read location of the user data, using the logical address. That is, the logical address corresponds to location information designated by the host device 2.

The memory system 1 includes a controller 100 and a NAND memory 200. The controller 100 is connected to the NAND memory 200 via a memory bus 300. The NAND memory 200 is an example of nonvolatile memory.

The controller 100 serves to perform control of the NAND memory 200.

The controller 100 writes data to the NAND memory 200 in response to a write request from the host device 2, and reads data from the NAND memory 200 in response to a read request from the host device 2 and transmits the data to the host device 2. Thus, the controller 100 transfers data between the host device 2 and the NAND memory 200.

Receiving data from the host device 2 along with a write request and initially writing the data to the NAND memory 200 is referred to as a host write operation. Data to be written to the NAND memory 200 by a host write operation is referred to as host data. The amount of host data written to the NAND memory 200 per unit time is referred to as a host write amount. A designer can freely set the unit time per which the host write amount and a transcription write amount described below are obtained.

The controller 100 further executes a transcription process to transcribe data within the NAND memory 200. The transcription process may also be referred to as garbage collection.

The transcription process includes reading data from the NAND memory 200 and writing the read data to the NAND memory 200. The write operation to the NAND memory 200 in the transcription process is referred to as a transcription write operation. Data written to the NAND memory 200 by a transcription write operation is referred to as transcription data. The amount of transcription data written to the NAND memory 200 per unit time is referred to as a transcription write amount. The transcription process will be described in detail below.

Further, the controller 100 can change the setting of the number of bits of a value to be written per memory cell. Setting of the number of bits of a value to be written per memory cell is referred to as a memory mode. Possible memory modes and a memory mode control method will be described later.

The controller 100 includes a processor 101, a host interface circuit (host I/F) 102, a random access memory (RAM) 103, a buffer memory 104, a memory interface circuit (memory I/F) 105, and an internal bus 106. The processor 101, the host I/F 102, the RAM 103, the buffer memory 104, and the memory I/F 105 are electrically connected to the internal bus 106.

The controller 100 can be configured as a system-on-a-chip (SoC). Alternatively, the controller 100 can include a plurality of chips. The RAM 103 or the buffer memory 104 may be disposed outside the controller 100.

The host I/F 102 serves to receive access commands and data from the host device 2, for example. The host I/F 102 transmits data read from the NAND memory 200 and responses to access commands to the host device 2.

The buffer memory 104 functions as a buffer for data transfer between the host device 2 and the NAND memory 200. The buffer memory 104 includes, for example, volatile memories such as static random access memory (SRAM) or synchronous dynamic random access memory (SDRAM). The types of memories constituting the buffer memory 104 are not limited to this example. The buffer memory 104 may include any type of nonvolatile memories.

The memory I/F 105 serves to control data write operation and data read operation with respect to the NAND memory 200 in accordance with an instruction from the processor 101.

The processor 101 is circuitry capable of executing computer programs. The processor 101 is exemplified by a central processing unit (CPU). The processor 101 collectively controls the elements of the controller 100 by a firmware program prestored in a given location (for example, the NAND memory 200), thereby implementing various kinds of operations of the controller 100.

The processing to be executed by the processor 101 may be partially or entirely executed by hardware circuitry. The processing to be executed by the processor 101 may be partially or entirely executed by a field-programmable gate array (FPGA) or an application specific integrated circuit (ASIC).

The RAM 103 can serve as a cache memory or a working memory for the processor 101. The RAM 103 includes dynamic random access memory (DRAM), SRAM, or a combination thereof. The types of memories constituting the RAM 103 are not limited to this example.

The controller 100 can include any element or elements instead of or in addition to the above elements. As an example, the controller 100 may include circuitry that encodes data to be written to the NAND memory 200 and decodes data read from the NAND memory 200. In addition, the RAM 103 may be used as a buffer memory, and in such a case, the buffer memory 104 may be omissible.

The NAND memory 200 is a NAND flash memory capable of storing user data in a nonvolatile manner. The NAND memory 200 includes one or more memory chips 201. Herein, the NAND memory 200 includes four memory chips 201-0, 201-1, 201-2, and 201-3 as an example. The NAND memory 200 is an exemplary flash memory.

Figure 2:
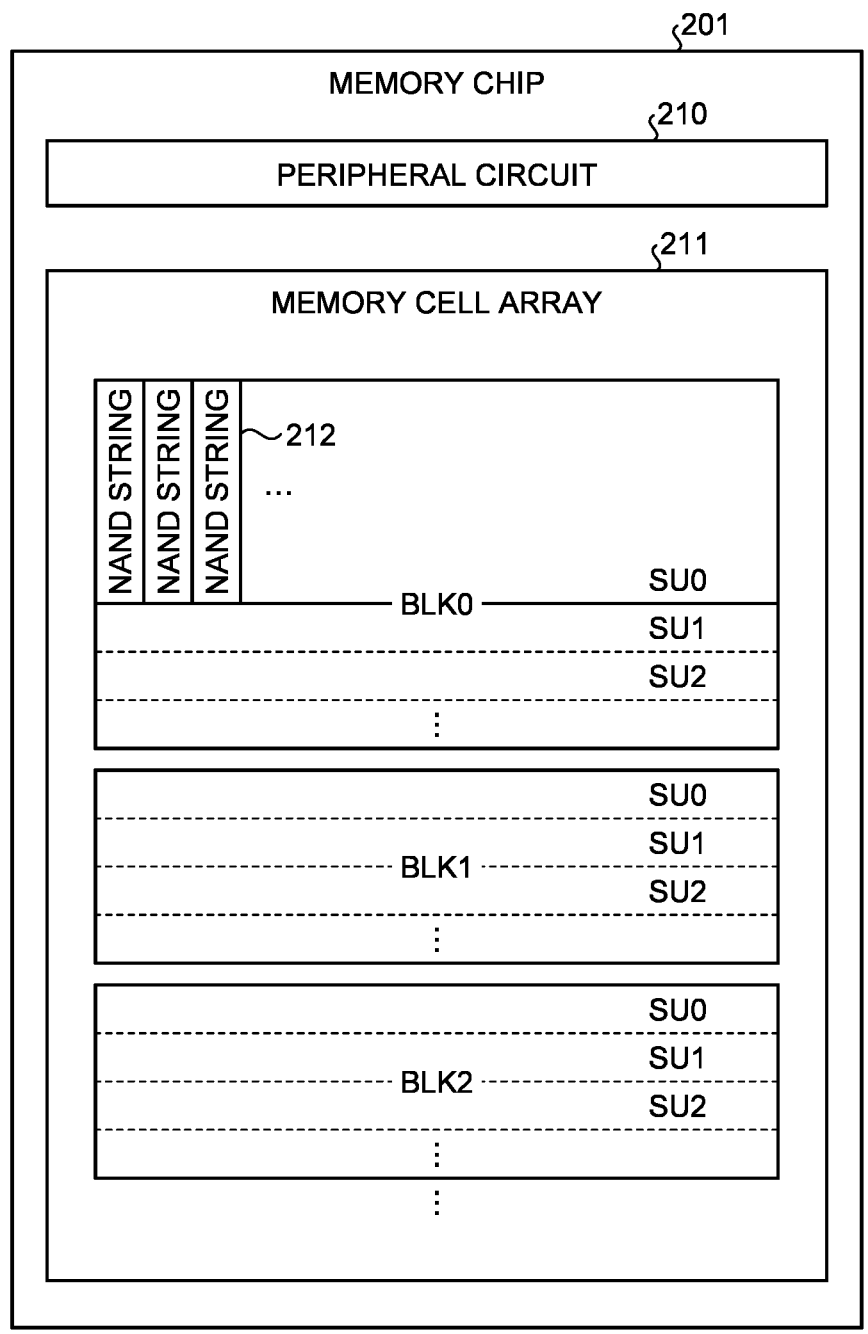
FIG. 2 is a schematic diagram illustrating an exemplary configuration of a memory chip in the first embodiment.

FIG. 2 is a schematic diagram illustrating an exemplary configuration of the memory chip 201 according to the first embodiment. The memory chip 201 includes a peripheral circuit 210 and a memory cell array 211.

The memory cell array 211 includes a plurality of blocks BLK (BLK0, BLK1, BLK2, . . . ). Each block BLK includes a plurality of string units SU (SU0, SU1, SU2, . . . ). Each string unit SU is an assembly of NAND strings including a plurality of nonvolatile memory cell transistors connected in series. The number of the NAND strings 212 included in each string unit SU can be freely set.

The peripheral circuit 210 includes, for example, a row decoder, a column decoder, a sense amplifier, a latch circuit, and a voltage generator circuit. In accordance with an instruction from the controller 100, the peripheral circuit 210 executes an operation corresponding to the instruction with respect to the memory cell array 211. The instruction from the controller 100 includes writing, reading, and erasing data.

Figure 3:
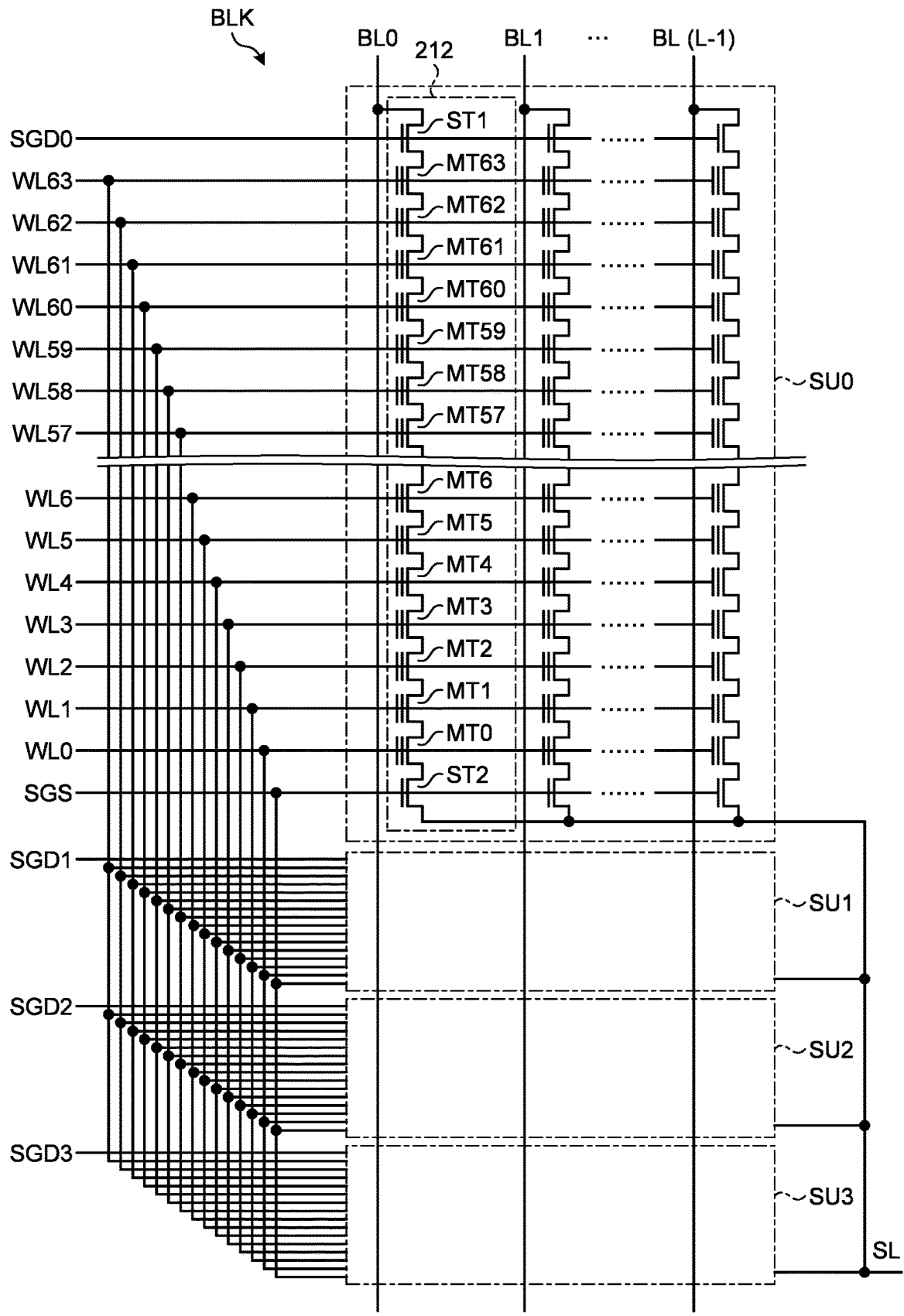
FIG. 3 is a schematic diagram illustrating a circuit configuration of a block BLK in the first embodiment.

FIG. 3 is a schematic diagram illustrating a circuit configuration of the block BLK in the first embodiment. The blocks BLK have the same configuration. Each block BLK includes, for example, four string units SU0 to SU3. Each string unit SU includes a plurality of NAND strings 212.

Each of the NAND strings 212 includes, for example, 64 memory cell transistors MT (MT0 to MT63) and selection transistors ST1 and ST2. Each memory cell transistor MT includes a control gate and a charge storage layer to store data in a nonvolatile manner. The 64 memory cell transistors MT (MT0 to MT63) are connected in series between the source of the selection transistor ST1 and the drain of the selection transistor ST2. The memory cell transistors MT may be a MONOS type including an insulating film as the charge storage layer or an FG type including a conductive film as the charge storage layer. The number of the memory cell transistors MT in the NAND string 212 is not limited to 64.

In the string units SU0 to SU3, the gates of the selection transistors ST1 are connected to selection gate lines SGD0 to SGD3, respectively. In the string units SU0 to SU3, however, the gates of the selection transistors ST2 are commonly connected to, for example, a selection gate line SGS. In the string units SU0 to SU3 the gates of the selection transistors ST2 may be connected to different selection gate lines SGS0 to SGS3 (not illustrated), respectively. In the same block BLK, the control gates of the memory cell transistors MT0 to MT63 are commonly connected to respective word lines WL0 to WL63.

In each string unit SU, the drains of the selection transistors ST1 of the NAND strings 212 are connected to different bit lines BL (BL0 to BL(L−1) where L is a natural number of two or more). The bit lines BL commonly connect one NAND string 212 in the string units SU across the plurality of blocks BLK. The sources of the selection transistors ST2 are connected in common to a source line SL.

Thus, the string unit SU is a set of a plurality of NAND strings 212 connected to the different bit lines BL and the same selection gate line SGD. The block BLK is a set of a plurality of string units SU sharing the word lines WL. The memory cell array 211 is a set of a plurality of blocks BLK sharing at least one bit line BL.

The peripheral circuit 21 can collectively write and read data to and from the memory cell transistors MT connected to one word line WL in one string unit SU. A group of memory cell transistors MT selected collectively to write and read data is referred to as a memory cell group MCG. A unit of a 1-bit data set to be written or read to or from one memory cell group MCG is referred to as a page.

The peripheral circuit 210 performs an erase operation in units of blocks BLK. Specifically, all the data stored in one block BLK is erased collectively.

The configuration of the memory cell array 211 is not limited to the configuration illustrated in FIGS. 2 and 3. For example, the memory cell array 211 may include two-dimensional or three-dimensional arrays of the NAND strings 212.

In writing data to the memory cell array 211, the peripheral circuit 210 injects an amount of charge corresponding to the data into the charge storage layer of each of the memory cell transistors MT corresponding to a write target page. In reading data from the memory cell array 211, the peripheral circuit 210 reads data corresponding to the amount of charge stored in the charge storage layer from each of the memory cell transistors MT corresponding to a read target page.

An n-bit (n≥1) value can be written to each memory cell transistor MT. A mode with n set to 1 is referred to as a single level cell (SLC) mode. In writing an n-bit value to each memory cell transistor MT, the memory capacity per memory cell group MCG is equal to an n-page size. A mode with n set to 2 is referred to as a multilevel cell (MLC) mode. A mode with n set to 3 is referred to as a triple level cell (TLC) mode. A mode with n set to 4 is referred to as a quad level cell (QLC) mode.

The threshold voltage of each memory cell transistor MT is controlled in a certain range by the peripheral circuit 210. The controllable threshold-voltage range is divided into sections of n-th power of 2, and different n-bit values are individually assigned to the sections.

Figure 4:
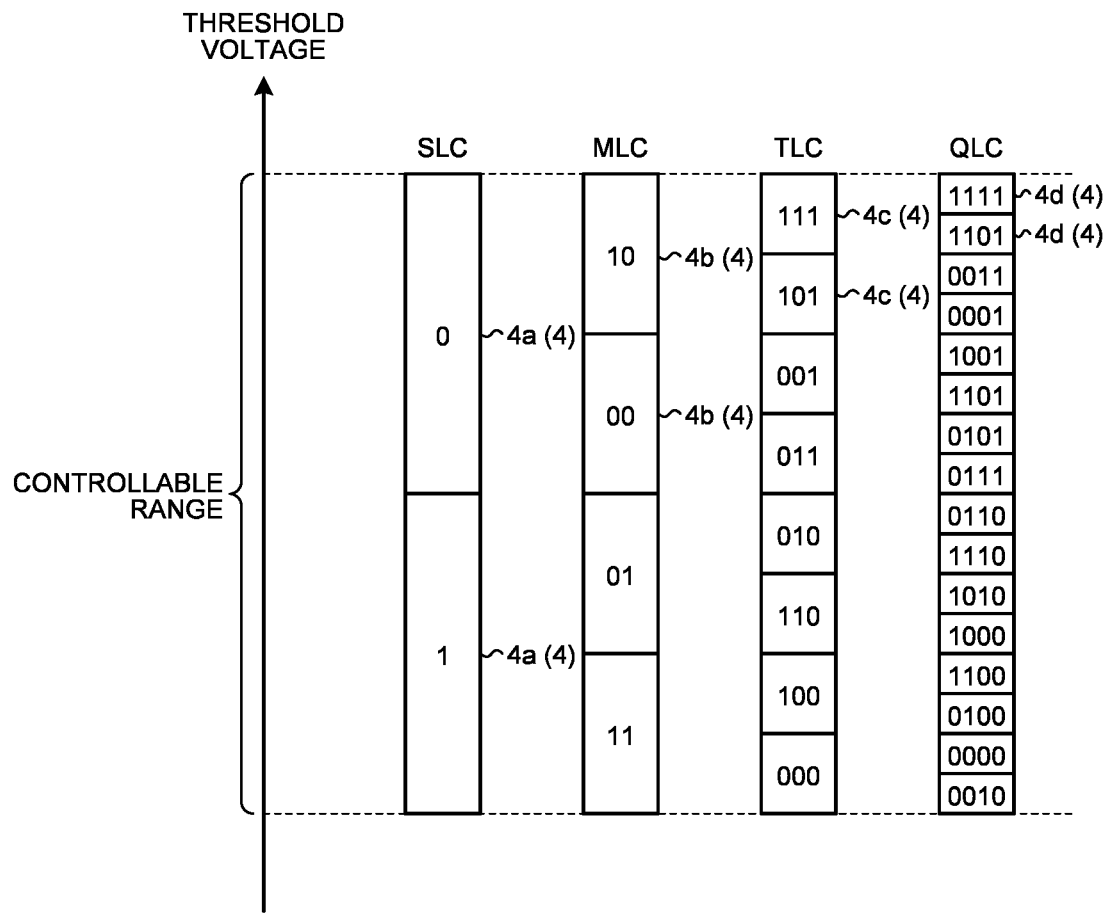
FIG. 4 illustrates sections in an SLC mode, an MLC mode, a TLC mode, and a QLC mode in the first embodiment.

FIG. 4 illustrates the sections in an SLC mode, a MLC mode, a TLC mode, and a QLC mode in the first embodiment. As illustrated in FIG. 4, the controllable is divided into a plurality of sections 4.

As an example, in the SLC mode the threshold voltage range is divided into two sections 4a. In the MLC mode the threshold voltage range is divided into four sections 4b. In the TLC mode the threshold voltage range is divided into eight sections 4c. In the QLC mode the threshold voltage range is divided into 16 sections 4d.

As the number of bits of the value stored in one memory cell increases, the range of each section 4 narrows. Values having the corresponding number of bits are assigned to the individual sections 4. In the SLC mode, the section 4a on the low-voltage side is assigned "1" and the section 4a on the high-voltage side is assigned "0". In the MLC mode, the four sections 4b are assigned "11", "01", "00", and "10" in the order of voltages. In the TLC mode, the eight sections 4c are assigned "111", "101", "001", "011", "010", "110", "100", and "000" in the order of voltages. In the QLC mode the 16 sections 4d are assigned "1111" "1011", "0011", "0001", "1001", "1101", "0101", "0111", "0110", "1110", "1010", "1000", "1100", "0100", "0000", and "0010" in the order of voltages. The method of assigning values to the sections 4 is not limited to these examples.

In the write operation to the memory cell array 211, the peripheral circuit 210 injects, into the charge storage layer of each memory cell transistor MT corresponding to a write target page, an amount of charge corresponding to the section 4 to which a value to be written is assigned. In the read operation to the memory cell array 211, the peripheral circuit 210 determines which one of the sections 4 includes the threshold voltages of the memory cell transistors MT corresponding to a read target page, and outputs the value assigned to the determined section 4 as read data.

In the erase operation to the memory cell array 211, the peripheral circuit 210 applies an erase voltage to the substrate side of the memory cell array 211. The peripheral circuit 210 then electrically connects all the word lines in an erase target block BLK to a ground potential. In the target block BLK, the individual memory cell transistors MT discharge the stored charge from the charge storage layers. As a result, the individual memory cell transistors MT in the target block BLK transition to a state considered as a data erased state (that is, the section 4 with a lowest voltage).

The memory system 1 is configured to be able to set or change the memory modes. More specifically, the processor 101 sets or changes the memory mode of each block BLK between a first mode in which a value having a first number of bits is written per memory cell and a second mode in which a value having a second number of bits (where the second number is larger than the first number) is written per memory cell. In the following, the first mode is defined as the SLC mode while the second mode is defined as the TLC mode. The first mode and the second mode are not limited to this example. Further, the minimum unit of the storage area for which the memory mode is set is not limited to the block BLK. As an example, the memory modes may be individually set in units of logical blocks including the plurality of blocks BLK.

Figure 5:
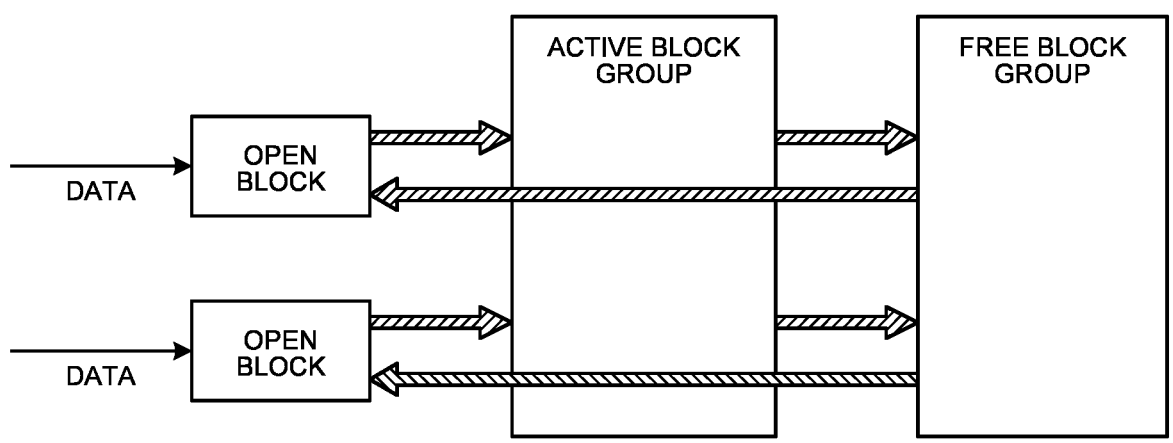
FIG. 5 is a diagram illustrating an example of state transition of the block BLK in the first embodiment.

Next, the state transition of the blocks BLK will be described. FIG. 5 illustrates a state transition of the blocks BLK in the first embodiment, by way of example. The hatched arrows indicate the direction of a state transition of the blocks BLK and the solid arrows indicate the direction of data transfer.

The blocks BLK can be in at least an open state, an active state, and a free state. Hereinafter, an open block may refer to a block BLK in an open state. An active block may refer to a block BLK in an active state. A free block may refer to a block BLK in a free state.

The open block is a block BLK being in the middle of a write operation, i.e., before completion of a write operation. In other words, the open block is a block BLK including a data writable region.

The active block is a block BLK after completion of a write operation. The active block is also considered as a block BLK remaining non-reusable. Among the blocks BLK after completion of a write operation, the block BLK storing valid user data is managed as an active block. The term "reuse" signifies allowing the block BLK to transition to an open block.

The free block is a block BLK storing no valid data. The free block is thus a reusable block BLK.

For example, the open block transitions to the active block after one-block data is written thereto. The data stored in the active block is in either a valid state or an invalid state.

While the active block stores certain data (referred to as first data), second data may be transmitted from the host device 2 with designation of the same logical address value as that of the first data. In such a case, the controller 100 writes the second data to an available page of the open block and manages the first data stored in the active block as invalid data. Because of this, the data stored in the active block may contain both valid data and invalid data.

The host device 2's transmitting new data to the memory system 1 with designation of the same logical address value as that of old data is referred to as a rewrite operation.

The active block transitions to a free block through a transcription process. The transcription process refers to a process of transcribing valid data from the active block to an open block and invalidating all data stored in the active block as a transcription source. Thereby, the active block being a transcription source transitions to a free block. Transcription can be also referred to as transfer, relocation, or translation.

The free block transitions to an open block after stored data is erased.

Validity of data signifies that a storage location of data concerned is associated with a logical address value. Invalidity of data signifies that a storage location of data concerned is not associated with any logical address value. Further, the term "free state" herein refers to a state that neither invalid data nor valid data is stored. Thus, the free page refers to an available, data writable region. The controller 100 maintains and updates the correspondence between locations in the block BLK and logical address values.

The host data and the transcription data may be written to the same open block. Alternatively, open blocks to which host data is written and open blocks to which transcription data is written may be separately prepared. Herein, both the host data and the transcription data are written to the same open block, as an example.

In the memory system 1 having not yet been subjected to a host write operation, all the blocks BLK except for the open blocks are free blocks. After start of a host write operation, the open block starts transitioning to an active block and the free block starts transitioning to an open block. This increases the number of active blocks and decreases the number of free blocks. If no free blocks remain, the memory system 1 starts a transcription process in order to maintain the number of free blocks at an allowable lower limit value or more, for example, at one or more. By the transcription process, the active block BLK transitions to a new free block.

Figure 6:
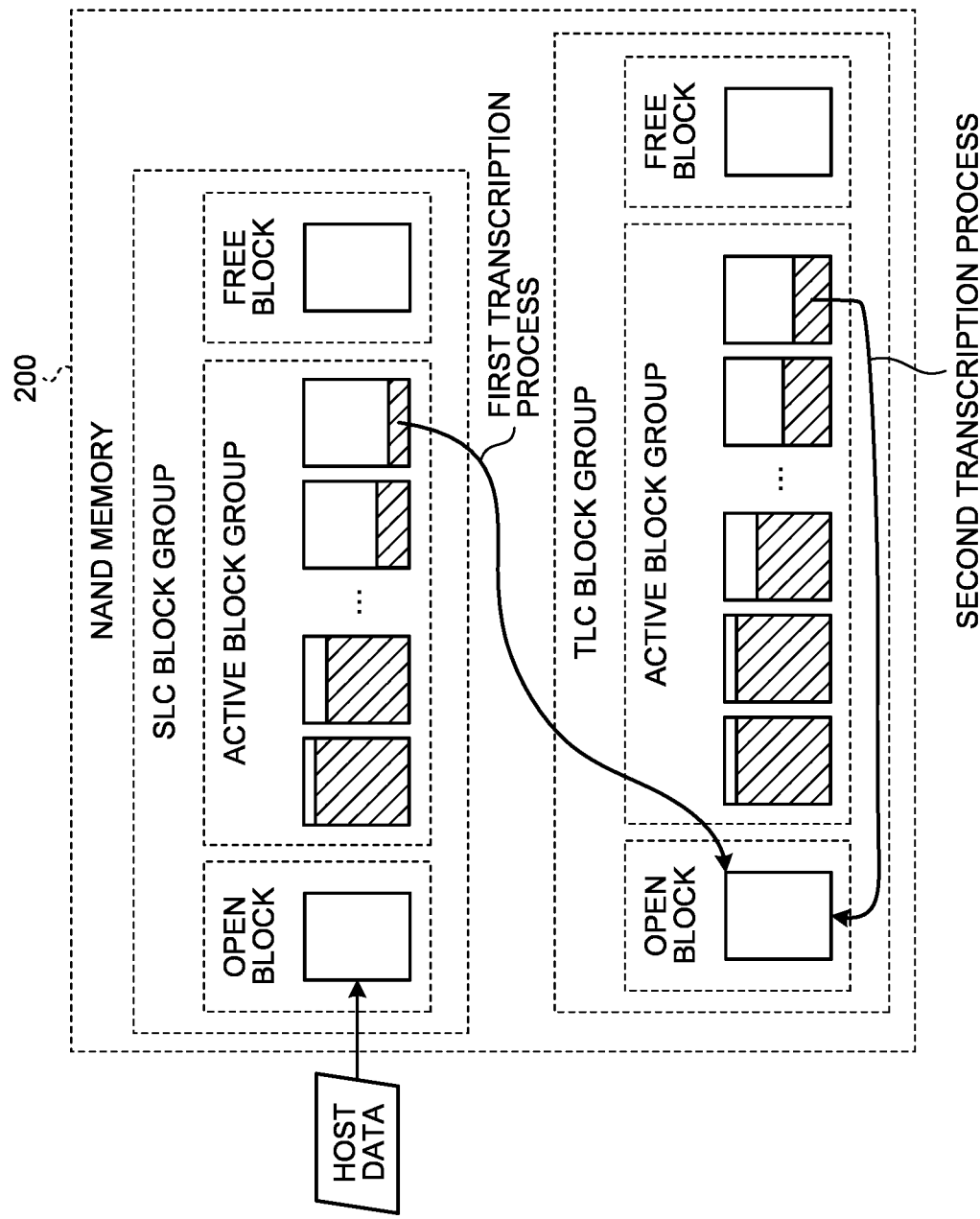
FIG. 6 is a schematic diagram for explaining a first transcription process and a second transcription process in the first embodiment.

In the first embodiment the transcription process includes a first transcription process and a second transcription process. FIG. 6 is a schematic diagram for explaining the first transcription process and the second transcription process in the first embodiment.

As illustrated in FIG. 6, part of the plurality of blocks BLK included in the NAND memory 200 is used in the SLC mode while another part of the plurality of blocks BLK is used in the TLC mode. The block BLK to be used in the SLC mode is referred to as an SLC block. The block BLK to be used in the TLC mode is referred to as a TLC block.

The blocks BLK included in the NAND memory 200 are an example of a plurality of first blocks. An SLC block group is an example of a plurality of second blocks. A TLC block group is an example of a plurality of third blocks.

The SLC block group and the TLC block group each include an open block and one or more free blocks. In the SLC block group and the TLC block group, the number of free blocks is maintained at the allowable lower limit value or more. In the example illustrated in FIG. 6, the allowable lower limit value of the number of free blocks is defined as one.

Each of the SLC block group and the TLC block group can further include one or more active blocks.

Hereinafter, the SLC block in the open state is referred to as an SLC open block. The SLC block in the active state is referred to as an SLC active block. The SLC block in the free state is referred to as an SLC free block. The TLC block in the open state is referred to as a TLC open block. The TLC block in the active state is referred to as a TLC active block. The TLC block in the free state is referred to as a TLC free block.

As the number of bits of data stored per memory cell decreases, the time required for writing and reading the data shortens. Thus, a data write operation completes earlier in the SLC mode than in the TLC mode. In view of this, in order to improve the throughput of the memory system 1 as viewed from the host device 2, the controller 100 writes the host data to the SLC block, specifically, the SLC open block.

A write operation to the SLC open block is considered as completed when the SLC open block becomes full of host data. After completion of the write operation to the SLC open block, the SLC open block transitions to the SLC active block, and one of the SLC free blocks transitions to a new SLC open block. When the number of SLC free blocks falls to the allowable lower limit value of 1, for example, any of the SLC active blocks is selected to transfer valid data from the selected SLC active block to the TLC open block through the first transcription process. The selected SLC active block then transitions to an SLC free block. Thus, the first transcription process refers to a process of transferring valid data from the SLC active block to the TLC open block in order to generate an SLC free block.

A write operation to the TLC open block is considered as completed when the TLC open block becomes full of transcription data. After completion of the write operation to the TLC open block, the TLC open block transitions to a TLC active block, and one of the TLC free blocks transitions to a new TLC open block. At a time when the number of TLC free blocks falls to the allowable lower limit value of 1, for example, any of the TLC active blocks is selected to transfer valid data from the selected TLC active block to the TLC open block through the second transcription process. The selected TLC active block transitions to a TLC free block. Thus, the second transcription process is a process of transferring valid data from the TLC active block to the TLC open block in order to generate a TLC free block.

In the first transcription process, the SLC active block storing as small amount of valid data as possible is selected as a transcription source so as to decrease a transcription write amount as much as possible. Typically, the SLC active block storing a minimum amount of valid data is selected as a transcription source.

Likewise, in the second transcription process the TLC active block storing as small amount of valid data as possible is selected as a transcription source so as to decrease a transcription write amount as much as possible. Typically, the TLC active block storing a minimum amount of valid data is selected as a transcription source.

Hereinafter, data stored in the block BLK is regarded as valid data. Likewise, data to be transcribed by the transcription process is regarded as valid data.

The performance of the memory system 1 is affected by execution of the transcription process, i.e., the first transcription process and the second transcription process. For example, the higher the execution frequency of the transcription process is, the more the hardware resources, such as the processor 101 and the buses (the internal bus 106 and the memory bus 300), allocated to the transcription process are. This causes a decrease in throughput of the memory system 1 as viewed from the host device 2. For another example, the higher the execution frequency of the transcription process is, the larger the number of write operations and erase operations to the NAND memory 200 is, resulting in accelerating the deterioration of the NAND memory 200. The deterioration of the NAND memory 200 leads to reliability degradation of the data stored in the NAND memory 200. For this reason, it is preferable to lower the execution frequency of the transcription process as much as possible.

According to the operation illustrated in FIG. 6, the written data in the SLC block is transcribed to the TLC block by the first transcription process or invalidated by a rewrite operation. Because of this, the execution frequency of the first transcription process is affected by the rewrite frequency of data transmitted from the host device 2 to the memory system 1. The rewrite frequency of data transmitted from the host device 2 to the memory system 1 differs depending on the data. Data being likely to be rewritten in a short period of time is referred to as hot data. Data being unlikely to be rewritten in a long period of time is referred to as cold data.

As an example, there may be a case that hot data in the SLC block becomes invalid by a new rewrite operation before being subjected to the first transcription process. Such a case is referred to as a first case. As the frequency at which the first case occurs heightens, the execution frequency of the first transcription process lowers.

Meanwhile, the first case is less likely to occur with respect to cold data in the SLC block. Specifically, it is probable that cold data in the SLC block is transferred to the TLC block by the first transcription process. Such a case is referred to as a second case. As the frequency at which the second case occurs heightens, the execution frequency of the first transcription process heightens.

The cold data in the TLC block can be subjected to the second transcription process until it becomes invalid by a new rewrite operation. The execution frequency of the second transcription process varies depending on a ratio of the total amount of cold data stored in the TLC block group to the total capacity of the TLC block group. The execution frequency of the second transcription process is more likely to increase as the ratio of the total amount of cold data stored in the TLC block group to the total capacity of the TLC block group increases.

An increase in the number of the SLC blocks leads to an increase in the frequency at which the first case occurs, making it possible to lower the execution frequency of the first transcription process. However, the increase in the number of the SLC blocks results in lowering the total capacity of the TLC block group by three times the increased capacity of the SLC blocks. Due to the lowered total capacity of the TLC block group, the ratio of the total amount of cold data stored in the TLC block group to the number of the TLC blocks increases. This results in heightening the execution frequency of the second transcription process.

As such, a too large number of SLC blocks does not lead to lowering the execution frequency of the transcription process, and a too small number of SLC blocks does not lead to lowering the execution frequency of the transcription process either. In other words, it is important to set the number of the SLC blocks appropriately in view of lowering the execution frequency of the transcription process.

In addition, an appropriate number of SLC blocks for lowering the execution frequency of the transcription process also depends on a relationship between the amount of hot data and the amount of cold data contained in host data.

For the host data containing hot data at a high proportion, for example, the decrease in the execution frequency of the first transcription process due to the increase in the number of SLC blocks is more advantageous, and the increase in the execution frequency of the second transcription process due to the decrease in the total capacity of the TLC block group is less disadvantageous, than for the host data containing hot data at a low proportion. As such, with respect to the host data containing hot data at a high proportion, the execution frequency of the transcription process can be efficiently lowered by allocating a larger number of blocks BLK to SLC blocks.

On the other hand, for the host data containing cold data at a high proportion, the decrease in the execution frequency of the first transcription process due to the increase in the number of SLC blocks is less advantageous, and the increase in the execution frequency of the second transcription process due to the decrease in the total capacity of the TLC block group is more disadvantageous, than for the host data containing cold data at a low proportion. Thus, with respect to the host data containing cold data at a high proportion, the execution frequency of the transfer process can be efficiently lowered by allocating a less number of blocks BLK to SLC blocks.

In the first embodiment the processor 101 controls the number of SLC blocks so as to be able to lower the execution frequency of the transcription process as much as possible irrespective of a change in the ratio of the amounts of hot data and cold data in the host data. The following will describe a control method of the number of SLC blocks. The ratio between the amount of hot data and the amount of cold data in the host data is referred to as a ratio of host data components.

While the ratio of host data components continues to be constant for a given time, the blocks BLK having transitioned to active blocks more previously are likely to store a less amount of valid data. Thus, when the ratio of host data components continues to be constant for a given time, it is probable that the TLC active block having transitioned to the active block most previously is to be selected as a source of the second transcription process.

With an increase in the proportion of hot data in the host data, however, the likeliness that the blocks BLK having transitioned to active blocks more previously store a less amount of valid data does not hold true. The increase in the proportion of hot data in the host data means an increase in amount of hot data to be transcribed to the TLC block by the first transcription process before being rewritten. The hot data in the TLC block is invalidated by a rewrite operation at a relatively early timing after the TLC block transitions to the active block. Because of this, in the TLC block including a large amount of hot data written by the first transcription process, the amount of valid data decreases at a higher speed. As a result, there may occur a case that the TLC block having transitioned to the active block relatively recently stores a less amount of valid data than the TLC block having transitioned to the active block more previously. Such a case is referred to as a third case.

From occurrence of the third case, an increase in the proportion of hot data in the host data can be inferred. In view of this, in the first embodiment an increase in the proportion of hot data in the host data is determined by detecting occurrence of the third case. Specifically, upon detection of the occurrence of the third case, the processor 101 increases the number of SLC blocks. The processor 101 increases the number of SLC blocks by allocating a less number of blocks BLK to the TLC blocks and allocating a larger number of blocks BLK to the SLC blocks among the blocks BLK included in the NAND memory 200.

Figure 7:
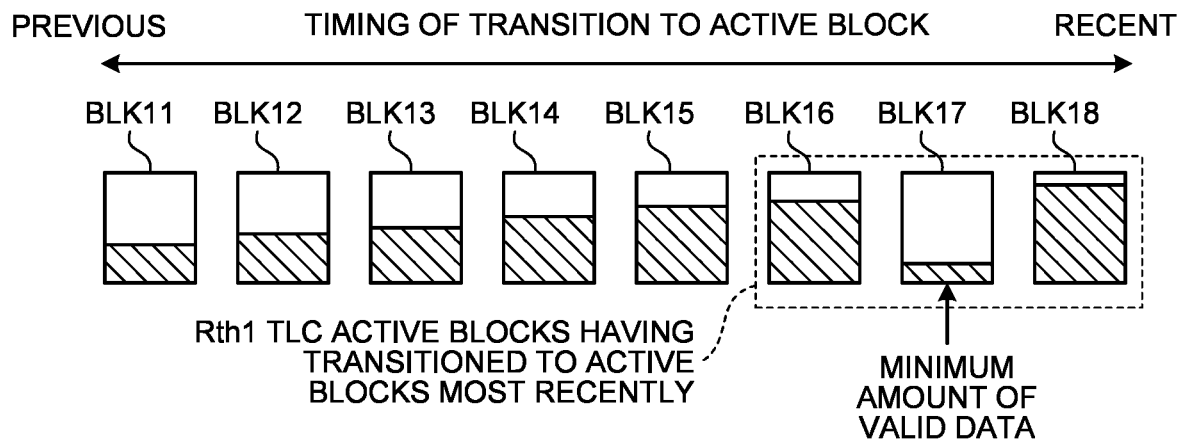
FIG. 7 is a schematic diagram for explaining an exemplary determination method for an increase in proportion of hot data in host data in the first embodiment.

FIG. 7 is a schematic diagram for explaining an exemplary determination method for an increase in proportion of hot data in host data according to the first embodiment. In FIG. 7 blocks BLK11 to BLK18 are active blocks included in the TLC block group, that is, TLC active blocks. The blocks BLK11 to BLK18 are arranged in the order of transition timings to the active blocks. It can be seen from FIG. 7 that the block BLK11, the block BLK12, the block BLK13, the block BLK14, the block BLK15, the block BLK16, the block BLK17, and the block BLK18 have transitioned to the active blocks in this order. The rectangles represent the blocks BLK11 to BLK18 and the hatched areas thereof indicate the amounts of valid data stored in the respective blocks BLK.

The processor 101 sets a value Rth1 in advance. The value Rth1 is set to an integer of 2 or more. The value Rth1 is an exemplary third number. A method of setting the value Rth1 will be described later. The processor 101 determines presence or absence of a TLC active block storing a minimum amount of valid data among Rth1 TLC active blocks having transitioned to the active blocks most recently. Presence of such a TLC active block storing a minimum amount of valid data among the Rth1 TLC active blocks corresponds to the third case. After determining that the TLC active block storing a minimum amount of valid data is present among the Rth1 TLC active blocks having transitioned to the active blocks most recently, the processor 101 thus increases the number of SLC blocks. After determining that the TLC active block storing a minimum amount of valid data is absent among the Rth1 TLC active blocks having transitioned to the active blocks most recently, the processor 101 refrains from increasing the number of SLC blocks.

In the example illustrated in FIG. 7, the value Rth1 is set to three. The three TLC active blocks having transitioned to the active blocks most recently, i.e., the blocks BLK16 to BLK18, include the block BLK17 being the TLC active block storing the minimum amount of valid data. The processor 101 thus increases the number of SLC blocks.

With a rapid increase in the proportion of hot data, as in the example illustrated in FIG. 7, the TLC block storing the minimum amount of valid data appears among the TLC blocks having transitioned to the active blocks relatively recently. With a gradual increase in the proportion of hot data, however, the TLC block storing the minimum amount of valid data may not appear among the TLC blocks having transitioned to the active blocks relatively recently. A method of determining an increase in the proportion of hot data even if the increase is gradual will be described with reference to FIG. 8.

Figure 8:
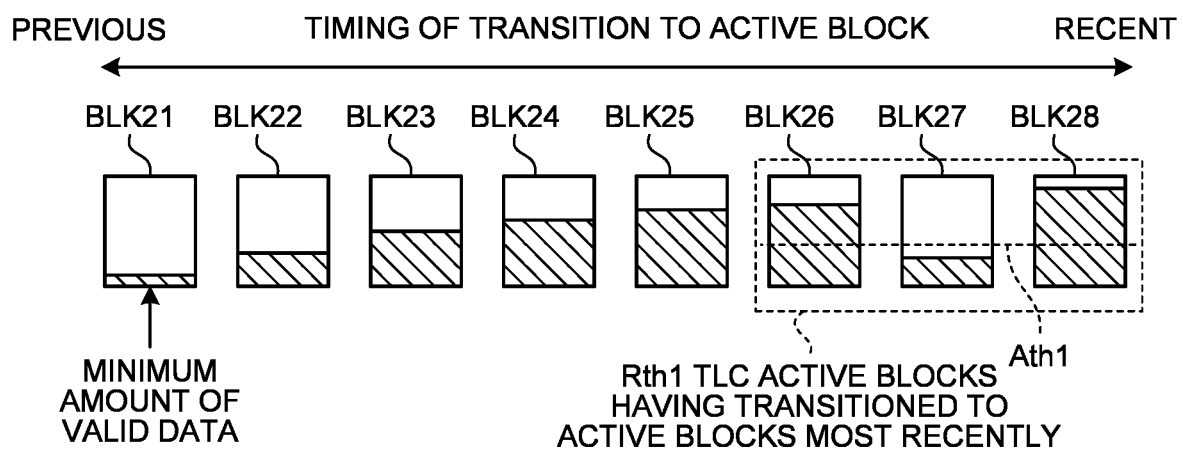
FIG. 8 is a schematic diagram for explaining another exemplary determination method for an increase in proportion of hot data in host data in the first embodiment.

FIG. 8 is a schematic diagram for explaining another example of a determination method for an increase in the proportion of hot data in host data in the first embodiment. In FIG. 8, blocks BLK21 to BLK28 are active blocks included in the TLC block group, i.e., TLC active blocks. The blocks BLK21 to BLK28 are arranged in the order of transition timings to the active blocks. It can be seen from FIG. 8 that the block BLK21, the block BLK22, the block BLK23, the block BLK24, the block BLK25, the block BLK26, the block BLK27, and the block BLK28 have transitioned to the active blocks in this order. The rectangles represent the blocks BLK21 to BLK28 and the hatched areas thereof indicate the amounts of valid data stored in the respective blocks BLK.

The processor 101 sets the value Rth1 in advance and obtains a value Ath1 in advance. The value Ath1 is an exemplary first threshold value. The value Ath1 may be a fixed value set by a designer or may be calculated by a given operation by the processor 101. The processor 101 determines presence or absence of a TLC active block storing a less amount of valid data than the value Ath1 among Rth1 TLC active blocks having transitioned to the active block most recently. Presence of a TLC active block storing a relatively small amount of valid data, even if not the minimum, among the Rth1 TLC active blocks may correspond to the third case. Thus, the processor 101 increases the number of SLC blocks after determining presence of a TLC active block storing a less amount of valid data than the value Ath1 among the Rth1 TLC active blocks having transitioned to the active block most recently. The processor 101 refrains from increasing the number of SLC blocks after determining that such a TLC active block is absent among the Rth1 TLC active blocks having transitioned to the active blocks most recently.

In the example illustrated in FIG. 8, the value Rth1 is set to three. The three TLC active blocks having transitioned to the active blocks most recently, i.e., the blocks BLK26 to BLK28, include the block BLK27 being the TLC active block storing a less amount of valid data than the value Ath1. In this case, the processor 101 increases the number of SLC blocks.

The processing to be executed when the Rth1 TLC active blocks having transitioned to the active blocks most recently include a TLC active block storing the same amount of valid data as the value Ath1 is not limited to the above example. When such a TLC active block storing the same amount of valid data as the value Ath1 is found among the Rth1 TLC active blocks having transitioned to the active blocks most recently, the processor 101 may increase the number of SLC blocks. When no TLC active block stores a same or less amount of valid data as or than the value Ath1 among the Rth1 TLC active blocks having transitioned to the active blocks most recently, the processor 101 may not increase the number of SLC blocks.

An increase in the proportion of cold data in the host data results in increasing the amount of data to be transcribed to the TLC block by the second transcription process. This increases the ratio of the total amount of cold data stored in the TLC block group to the total capacity of the TLC block group, which leads to increasing the amount of valid data stored in the block to be a transcription source in the second transcription process, that is, the TLC active block storing the minimum amount of valid data. Thereby, the transcription write amount for generating one TLC free block increases. In other words, the execution frequency of the second transcription process heightens.

Figure 9:
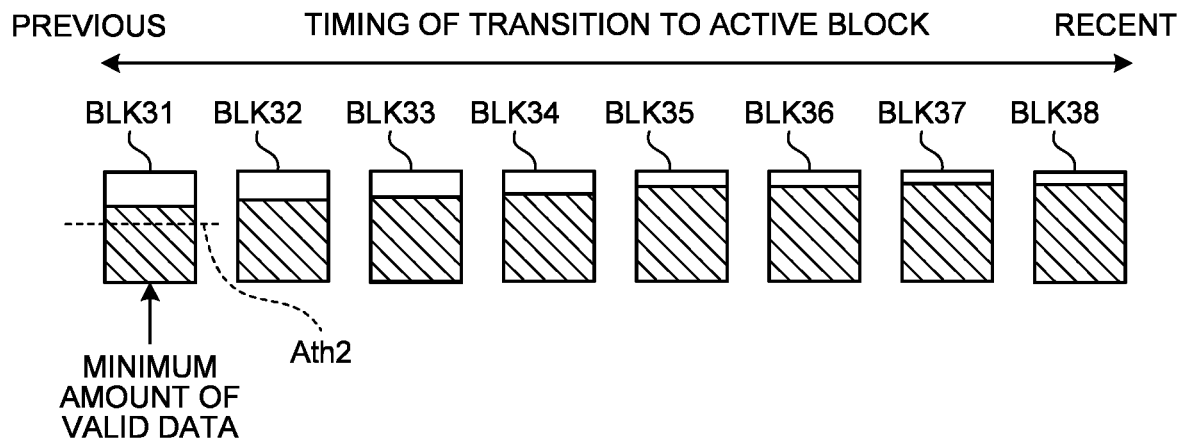
FIG. 9 is a schematic diagram for explaining an exemplary determination method for an increase in proportion of cold data in host data in the first embodiment.

FIG. 9 is a schematic diagram for explaining an exemplary determination method for an increase in proportion of cold data in host data in the first embodiment. In FIG. 9, blocks BLK31 to BLK38 are active blocks included in the TLC block group, i.e., TLC active blocks. The blocks BLK31 to BLK38 are arranged in the order of transition timings to the active blocks. It can be seen from FIG. 9 that the block BLK31, the block BLK32, the block BLK33, the block BLK34, the block BLK35, the block BLK36, the block BLK37, and the block BLK38 have transitioned to the active blocks in this order. The rectangles represent the blocks BLK31 to BLK38 and the hatched areas thereof indicate the amounts of valid data stored in the respective blocks BLK.

The processor 101 obtains a value Ath2 in advance. The value Ath2 is an exemplary second threshold value. The value Ath2 may be a fixed value set by the designer or may be calculated by a given operation by the processor 101. The processor 101 determines whether or not the TLC active block having transitioned to the active block most previously stores a same or more amount of valid data as or than the value Ath2.

As described above, while the ratio of host data components continues to be constant for a given period, the blocks BLK having transitioned to the active blocks more previously are likely to store a less amount of valid data. In addition, as the proportion of cold data increases, the amount of valid data increases in the TLC active block storing the minimum amount of valid data. As such, an increase in the proportion of cold data results in increasing the amount of valid data stored in the TLC active block having transitioned to the active block most previously. According to such a phenomenon, the processor 101 determines an increase in the proportion of cold data by determining whether or not the TLC active block having transitioned to the active block most previously stores a same or more amount of valid data as or than a given value, i.e., the value Ath2 in this example.

An increase in the proportion of the cold data can be inferred from the fact that the TLC active block having transitioned to the active block most previously stores a same or more amount of valid data as or than the value Ath2. In such a case, the processor 101 decreases the number of SLC blocks. The processor 101 increases the number of TLC blocks by allocating a decreased number of blocks BLK to the SLC blocks and an increased number of blocks BLK to the TLC blocks among the blocks BLK included in the NAND memory 200.

Non-increase in the proportion of cold data can be inferred from the fact that the TLC active block having transitioned to the active block most previously stores a less amount of valid data than the value Ath2. In such a case, the processor 101 refrains from decreasing the number of SLC blocks.

In the example illustrated in FIG. 9, the block BLK31 is the TLC active block having transitioned to the active block most previously, and it stores a larger amount of valid data than the value Ath2. The processor 101 thus decreases the number of SLC blocks.

The processing to be executed when the TLC active block having transitioned to the active block most previously stores the same amount of valid data as the value Ath2 is not limited to the above example. In such a case, the processor 101 may not decrease the number of SLC blocks.

According to the example illustrated in FIG. 9, the processor 101 makes a determination as to an increase in the proportion of cold data from only the TLC active block having transitioned to the active block most previously. Two or more TLC active blocks having transitioned to the active blocks relatively previously may be used for determining an increase in the proportion of cold data. An example of using two or more TLC active blocks having transitioned to the active blocks relatively previously for determining an increase in the proportion of cold data will be described with reference to FIG. 10.

Figure 10:
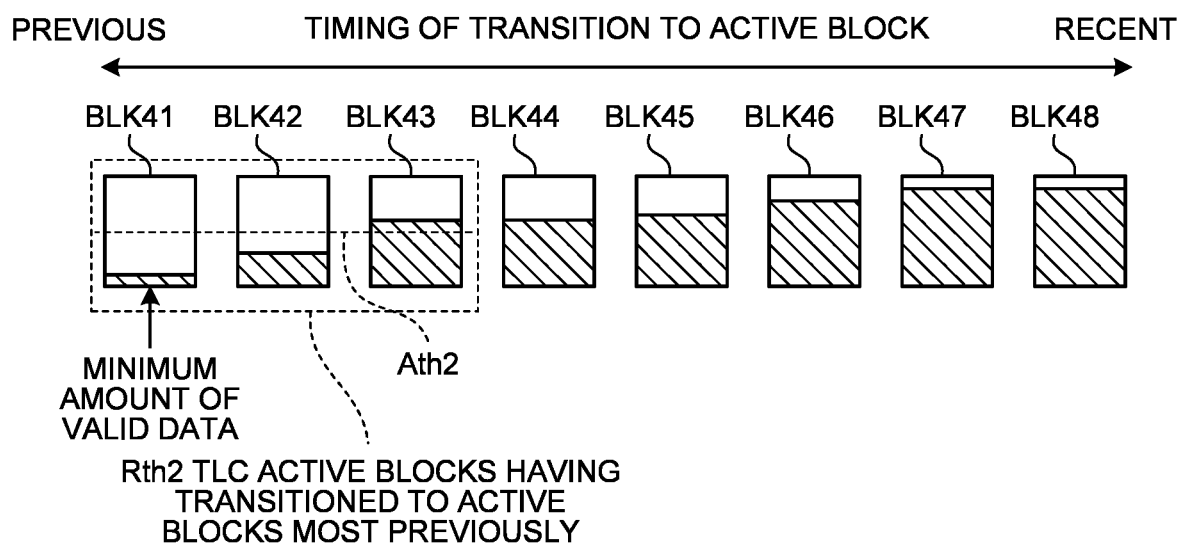
FIG. 10 is a schematic diagram for explaining another exemplary determination method for an increase in proportion of cold data in host data in the first embodiment.

FIG. 10 is a schematic diagram for explaining another example of a determination method for an increase in proportion of cold data in host data in the first embodiment. In FIG. 10, blocks BLK41 to BLK48 are active blocks included in the TLC block group, that is, TLC active blocks. The blocks BLK41 to BLK48 are arranged in the order of transition timings to the active blocks. It can be seen from FIG. 10 that the block BLK41, the block BLK42, the block BLK43, the block BLK44, the block BLK45, the block BLK46, the block BLK47, and the block BLK48 have transitioned to the active blocks in this order. The rectangles represent the blocks BLK41 to BLK48 and the hatched areas thereof indicate the amounts of valid data stored in the respective blocks BLK.

The processor 101 obtains the value Ath2 in advance and sets a value Rth2 in advance. The value Rth2 is set to an integer of 2 or more. The value Rth2 is an exemplary fourth number. A setting method of the value Rth2 will be described later. The processor 101 determines presence or absence of a TLC active block storing a same or larger amount of valid data as or than the value Ath2 among Rth2 TLC active blocks having transitioned to the active blocks most previously. When such a TLC active block storing a same or larger amount of valid data as the value Ath2 is present among the Rth2 TLC active blocks having transitioned to the active blocks most previously, the processor 101 decreases the number of SLC blocks. The processor 101 refrains from decreasing the number of SLC blocks when no TLC active block stores a same or larger amount of valid data as or than the value Ath2 among the Rth2 TLC active blocks having transitioned to the active blocks most previously.

The processing to be executed when the Rth2 TLC active blocks having transitioned to the active blocks most previously include a TLC active block storing the same amount of valid data as the value Ath2 is not limited to the above example. If a TLC active block storing a larger amount of valid data than the value Ath2 is present among the Rth2 TLC active blocks having transitioned to the active blocks most previously, the processor 101 may decrease the number of SLC blocks. When no TLC active block among the Rth2 TLC active blocks stores a larger amount of valid data than the value Ath2, the processor 101 may refrain from decreasing the number of SLC blocks.

As described above, the processor 101 controls the number of SLC blocks according to the order of transition timings of the TLC active blocks to the active blocks, i.e., the order of completion of write operations, and the amount of valid data stored in each TLC active block.

Next, an operation of the memory system 1 according to the first embodiment will be described with reference to a flowchart.

Figure 11:
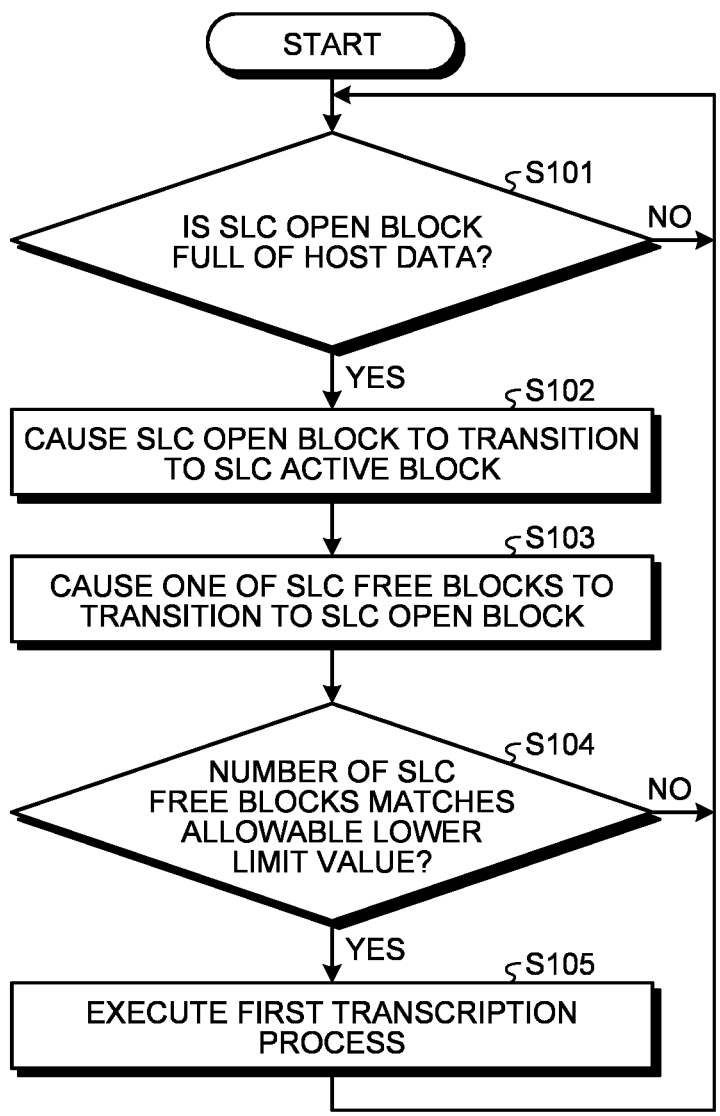
FIG. 11 is a flowchart illustrating an exemplary execution timing of the first transcription process in the first embodiment.

FIG. 11 is a flowchart illustrating an exemplary execution timing of the first transcription process in the first embodiment.

The controller 100 writes host data to an SLC open block. First, the processor 101 determines whether or not the SLC open block is full of host data (S101). After determining that the SLC open block is not full of host data (S101: No), that is, the SLC open block still includes a writable region, the processor 101 executes the operation of S101 again.

After determining that the SLC open block is full of host data (S101: Yes), that is, the SLC open block includes no writable region, the processor 101 causes the SLC open block to transition to the SLC active block (S102), and causes one of the SLC free blocks to transition to the SLC open block (S103).

The processor 101 determines whether or not the number of the SLC free blocks matches the lower limit value (S104). When the number of the SLC free blocks does not match the lower limit value (S104: No), the processor 101 proceeds to S101.

When the number of the SLC free blocks matches the lower limit value (S104: Yes), the controller 100 executes the first transcription process (S105). The controller 100 continuously executes the first transcription process until at least one SLC free block is generated.

The execution timing of the first transcription process is not limited to the example illustrated in FIG. 11. In addition to the execution timing illustrated in FIG. 11, the controller 100 may execute the first transcription process in a period where no access from the host device 2 occurs.

Figure 12:
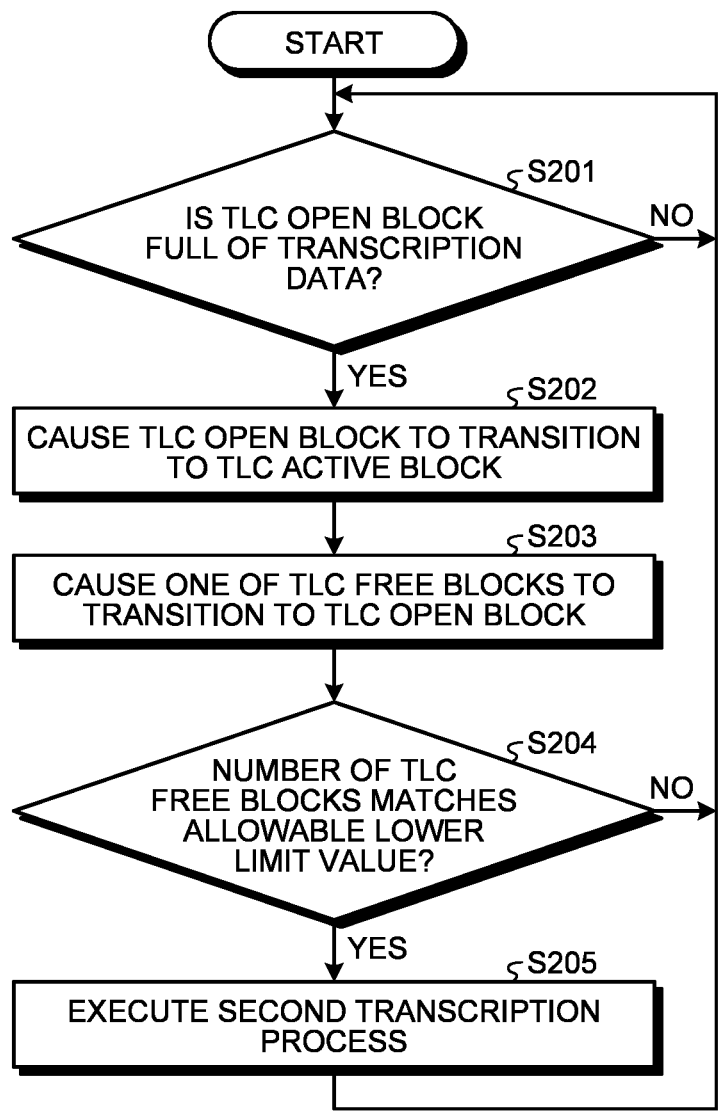
FIG. 12 is a flowchart illustrating an exemplary execution timing of the second transcription process in the first embodiment.

FIG. 12 is a flowchart illustrating an exemplary execution timing of the second transcription process in the first embodiment.

The controller 100 writes transcription data obtained by the first transcription process and the second transcription process to the TLC open block. First, the processor 101 determines whether or not the TLC open block is full of transcription data (S201). After determining that the TLC open block is not full of transcription data (S201: No), that is, the TLC open block still includes a writable region, the processor 101 executes the operation of S201 again.

After determining that the TLC open block is full of transcription data (S201: Yes), that is, the TLC open block includes no writable region, the processor 101 causes the TLC open block to transition to the TLC active block (S202), and causes one of the TLC free blocks to transition to the TLC open block (S203).

The processor 101 determines whether or not the number of the TLC free blocks matches the lower limit value (S204). When the number of the TLC free blocks does not match the lower limit value (S204: No), the processor 101 proceeds to S201.

When the number of the TLC free blocks matches the lower limit value (S204: Yes), the controller 100 executes the second transcription process (S205). The controller 100 continuously executes the second transcription process until at least one TLC free block is generated.

The execution timing of the second transcription process is not limited to the example illustrated in FIG. 12. In addition to the execution timing illustrated in FIG. 12, the controller 100 may execute the second transcription process in a period where no access from the host device 2 occurs.

Figure 13:
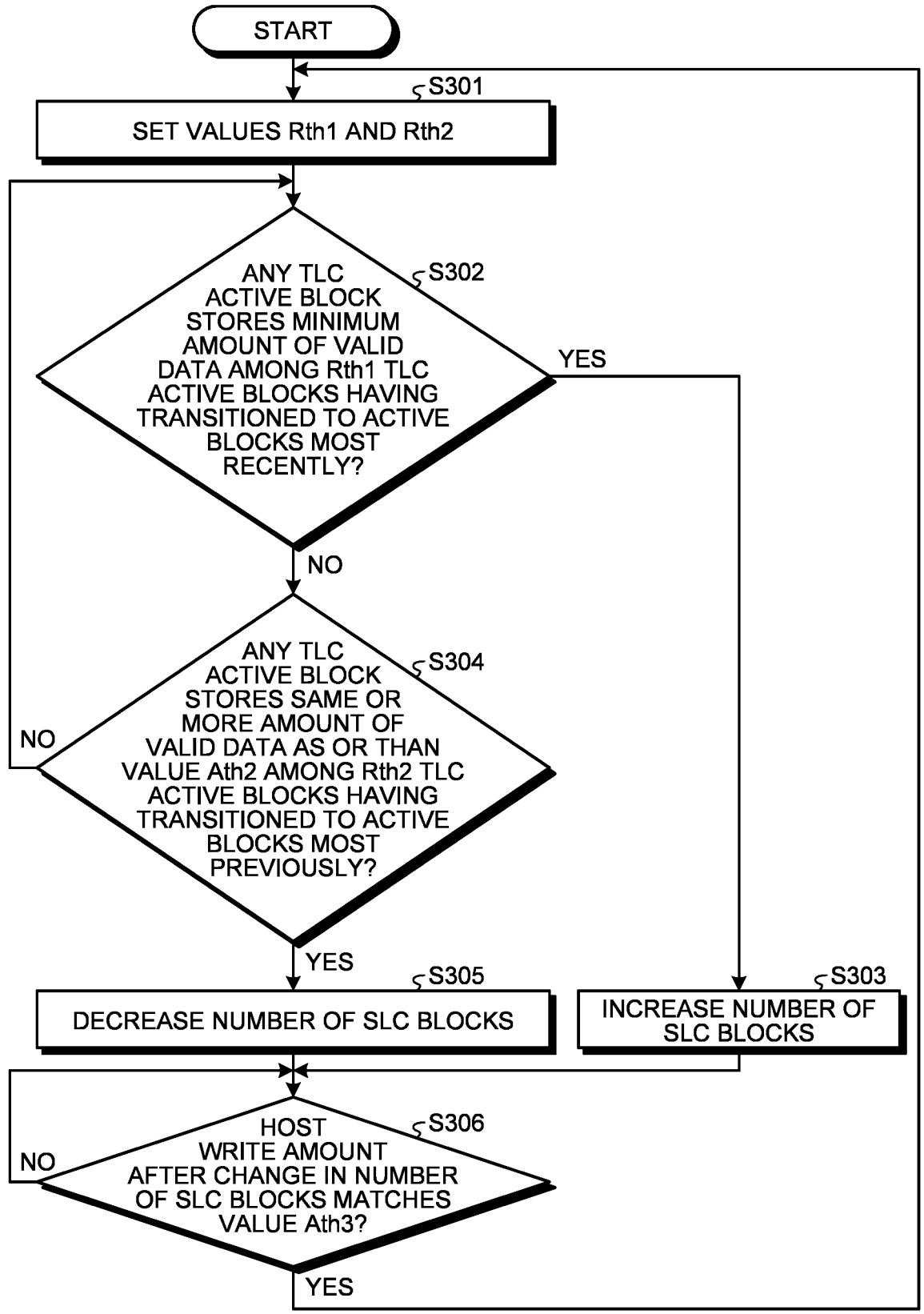
FIG. 13 is a flowchart illustrating a control method of the number of SLC blocks in the first embodiment.

FIG. 13 is a flowchart illustrating a control method of the number of SLC blocks according to the first embodiment. In an exemplary control method illustrated in FIG. 13, a determination is made on whether or not to increase the number of SLC blocks by the method illustrated in FIG. 7 and whether or not to decrease the number of SLC blocks by the method illustrated in FIG. 10. Alternatively, the method illustrated in FIG. 8 is adoptable in place of the method illustrated in FIG. 7. The method illustrated in FIG. 9 is adoptable in place of the method illustrated in FIG. 10.

First, the processor 101 sets the values Rth1 and Rth2 (S301).

As an example, the processor 101 obtains each of the values Rth1 and Rth2 by multiplying the total number of TLC active blocks by a constant of larger than zero and less than one. The constant by which the total number of TLC active blocks is multiplied may be prepared individually for the values Rth1 and Rth2 or may be set in common for the values Rth1 and Rth2. Any digits after the decimal point in the value obtained by multiplying the total number of TLC active blocks by the constant are rounded up or down.

Alternatively, the values Rth1 and Rth2 may be fixed values. The designer stores the values Rth1 and Rth2 in a given region (for example, the NAND memory 200) in advance. In S301 the processor 101 may read the values Rth1 and Rth2 individually.

Subsequently, the processor 101 determines presence or absence of a TLC active block storing a minimum amount of valid data among Rth1 TLC active blocks having transitioned to the active blocks most recently (S302).

After determining that the TLC active block storing the minimum amount of valid data is present among the Rth1 TLC active blocks having transitioned to the active block most recently (S302: Yes), the processor 101 increases the number of SLC blocks (S303).

In S303 the processor 101 increases the number of SLC blocks by a predetermined number. The processor 101 increases the number of SLC blocks, for example, by changing a predetermined number of TLC free blocks to SLC free blocks. When the number of the TLC free blocks is insufficient, the processor 101 can generate a predetermined number of TLC free blocks by executing the second transcription process. Note that the method of increasing the number of SLC blocks is not limited to this example. The increment of the number of SLC blocks by one operation of S303 may be fixed or variable.

After the operation of S303, the processor 101 executes the operation of S306, which will be described later.

After determining that the TLC active block storing the minimum amount of valid data is absent among the Rth1 TLC active blocks having transitioned to the active blocks most recently (S302: No), the processor 101 determines presence or absence of a TLC active block storing a same or more amount of valid data as or than the value Ath2 among the Rth2 TLC active blocks having transitioned to the active blocks most previously (S304).

After determining that the TLC active block storing a same or more amount of valid data as or than the value Ath2 is present among the Rth2 TLC active blocks having transitioned to the active blocks most previously (S304: Yes), the processor 101 decreases the number of SLC blocks (S305).

In S305 the processor 101 decreases the number of SLC blocks by a predetermined number. The processor 101 decreases the number of SLC blocks, for example, by changing a predetermined number of SLC free blocks to TLC free blocks. When the number of the SLC free blocks is insufficient, the processor 101 can generate a predetermined number of SLC free blocks by executing the first transcription process. The method of decreasing the number of SLC blocks is not limited to this example. The decrement of the number of SLC blocks by one operation of S305 may be fixed or variable.

After S303 or S305, the processor 101 determines whether or not the host write amount after the change in the number of SLC blocks matches a value Ath3 (S306).

The processor 101 controls the number of SLC blocks according to the order of transition timings of the respective TLC active blocks to the active blocks and the amount of valid data stored in each TLC active block. For a while after the change in the number of SLC blocks, however, the order of transition timings of the respective TLC active blocks to the active blocks and the amount of valid data stored in each TLC active block may continue to be unsuitable for determining the increase or decrease in the number of SLC blocks. In view of this, the processor 101 postpones the determinations as to increasing and decreasing the number of SLC blocks for a certain period after changing the number of SLC blocks.

S306 corresponds to the operation to postpone the determination as to increase or decrease in the number of SLC blocks. The value Ath3 is a threshold value for defining, by the host write amount, a determination postponing period for the increase or decrease in the number of SLC blocks. The designer can set the value Ath3 by any method. The value Ath3 is an exemplary first amount.

The method of defining the determination postponing period for the increase and decrease in the number of SLC blocks is not limited to the method using the host write amount. The processor 101 may postpone the determinations as to increasing and decreasing the number of SLC blocks until a given time elapses from the change in the number of SLC blocks.

When the host write amount after the change in the number of SLC blocks does not match the value Ath3 (S306: No), the processor 101 makes the determination in S306 again. When the host write amount after the change in the number of SLC blocks matches the value Ath3 (S306: Yes), the processor 101 executes the operation of S301.

The processor 101 executes the operation of S302 when the Rth2 TLC active blocks having transitioned to the active blocks most previously include no TLC active block storing a same or more amount of valid data as or than the value Ath2 (S304: No).

According to the example illustrated in FIG. 13, the processor 101 makes a determination as to decreasing the number of SLC blocks (for example, the operation of S304) after making a determination as to increasing the number of SLC blocks (for example, the operation of S302). The processor 101 may make the determination as to decreasing the number of SLC blocks (for example, the operation of S304) first, and upon determining not to decrease the number of SLC blocks, may make the determination as to increasing the number of SLC blocks (for example, the operation of S302). As such, the operations illustrated in FIG. 13 may be appropriately changed in order.

Alternatively, the processor 101 may make the determination as to increasing the number of SLC blocks (for example, the operation of S302), and then make the determination as to decreasing the number of SLC blocks (for example, the operation of S304). After determining neither increase nor decrease in the number of SLC blocks, the processor 101 may postpone the determinations as to increasing and decreasing the number of SLC blocks for a certain period. The processor 101 may postpone a next determination until the host write amount matches the value Ath3, irrespective of an increase or decrease in the number of SLC blocks.

According to the first embodiment as described above, the controller 100 controls the number of SLC blocks according to the order of the transition timings of the respective TLC active blocks to the active blocks, i.e., the order of completion of write operations, and the amount of valid data stored in each TLC active block.

Consequently, in response to a change in the ratio of host data components, the controller 100 efficiently lower the execution frequency of the transcription process by appropriately changing the number of SLC blocks. Decrease in the execution frequency of the transcription process results in improvement in performance of the memory system 1. According to the first embodiment, thus, the memory system 1 can control the number of bits of the value to be written per memory cell so as to improve its performance as much as possible.

Further, according to the first embodiment, the controller 100 increases the number of SLC blocks when among the TLC active blocks, the Rth1 TLC active blocks having transitioned to the active blocks most recently, include a TLC active block storing the minimum amount of valid data, for example.

Thus, in response to an increase in the proportion of hot data in the host data, the controller 100 can lower the execution frequency of the transcription process by appropriately increasing the number of SLC blocks.

Further, according to the first embodiment, when among the TLC active blocks, the Rth1 TLC active blocks having transitioned to the active blocks most recently, include a TLC active block storing a less amount of valid data than the value Ath1, the controller 100 increases the number of SLC blocks.

As such, in response to an increase in the proportion of hot data in the host data, the controller 100 can lower the execution frequency of the transcription process by appropriately increasing the number of SLC blocks.

Further, according to the first embodiment, when among the TLC active blocks, the TLC active block having transitioned to the active block most previously, stores a larger amount of valid data than the value Ath2, the controller 100 decreases the number of SLC blocks.

As such, in response to an increase in the proportion of cold data in the host data, the controller 100 can lower the execution frequency of the transcription process by appropriately decreasing the number of SLC blocks.

Alternatively, according to the first embodiment, when among the TLC active blocks, the Rth2 TLC active blocks having transitioned to the active blocks most previously, include a TLC active block storing a larger amount of valid data than the value Ath2, the controller 100 decreases the number of SLC blocks.

Thus, in response to an increase in the proportion of cold data in the host data, the controller 100 can lower the execution frequency of the transcription process by appropriately decreasing the number of SLC blocks.

Further, according to the first embodiment the controller 100 postpones the determinations as to increasing and decreasing the number of SLC blocks after increasing or decreasing the number of SLC blocks, until the host write amount matches the value Ath3. Thereby, the controller 100 postpones controlling of the number of second blocks.

Thus, the controller 100 can postpone controlling of the number of second blocks during a period not suitable for determining whether to increase the number of SLC blocks and decrease the number of SLC blocks.

Second Embodiment

In a second embodiment, the number of SLC blocks is controlled according to a result of comparison between the host write amount and the transcription write amount. Hereinafter, a memory system of the second embodiment will be described. Note that the functions of the memory system of the second embodiment and the elements included in the memory system are the same as those of the first embodiment except for the function of controlling the number of SLC blocks. In the following, the memory system and the elements of the memory system are denoted by the same names and reference numerals as those in the first embodiment.

In the second embodiment, the host write amount is an exemplary first data amount. The transcription write amount is an exemplary second data amount.

Figure 14:
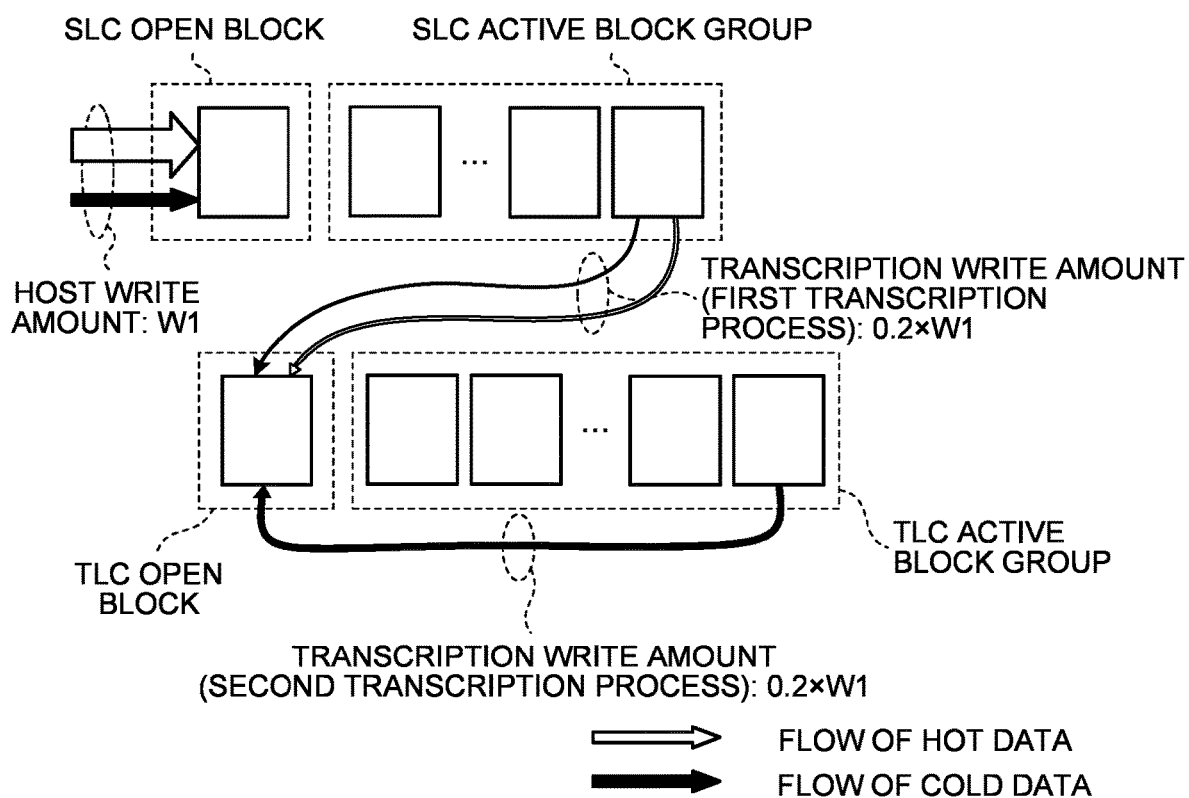
FIG. 14 schematically illustrates an exemplary relationship between a host write amount and a transcription write amount in a memory system of a second embodiment, when host data contains hot data at a relatively high proportion.

FIG. 14 is a schematic diagram for explaining an exemplary relationship between a host write amount and a transcription write amount in a memory system 1 of the second embodiment, when host data includes hot data at a relatively large proportion. FIG. 14 illustrates an SLC block group and a TLC block group included in a NAND memory 200. FIG. 14 omits illustrating an SLC free block and a TLC free block. The open arrows indicate a flow of hot data and the solid arrows indicate a flow of cold data.

Hot data and cold data are written to the SLC open block. Not only cold data but also some hot data is written to the TLC open block by the first transcription process. In the TLC block group, most of the hot data is invalidated by a rewrite operation before being subjected to the second transcription process. Thus, in the example illustrated in FIG. 14, only the cold data is written to the TLC open block in the second transcription process.

A less host write amount means that it takes more time from setting one SLC open block to the SLC open block's becoming full of host data. In other words, as the host write amount lessens, the execution frequency of the first transcription process is more likely to lower. Further, a less transcription write amount means that it takes more time from setting one TLC open block to the TLC open block's becoming full of transcription data. Thus, as the transcription write amount lessens, the execution frequency of the second transcription process is more likely to lower. In view of such a likeliness, in a situation that the transcription write amount is less than the host write amount, it can be considered that it is possible to decrease the number of TLC blocks.

According to the example illustrated in FIG. 14, when the host write amount is defined as W1, the transcription write amounts by the first transcription process and by the second transcription process are both found as 0.2×W1. Thus, the sum of the transcription write amounts by the first transcription process and by the second transcription process is found as 0.4×W1, which is less than the host write amount. In such a case, the processor 101 increases the number of SLC blocks.

Figure 15:
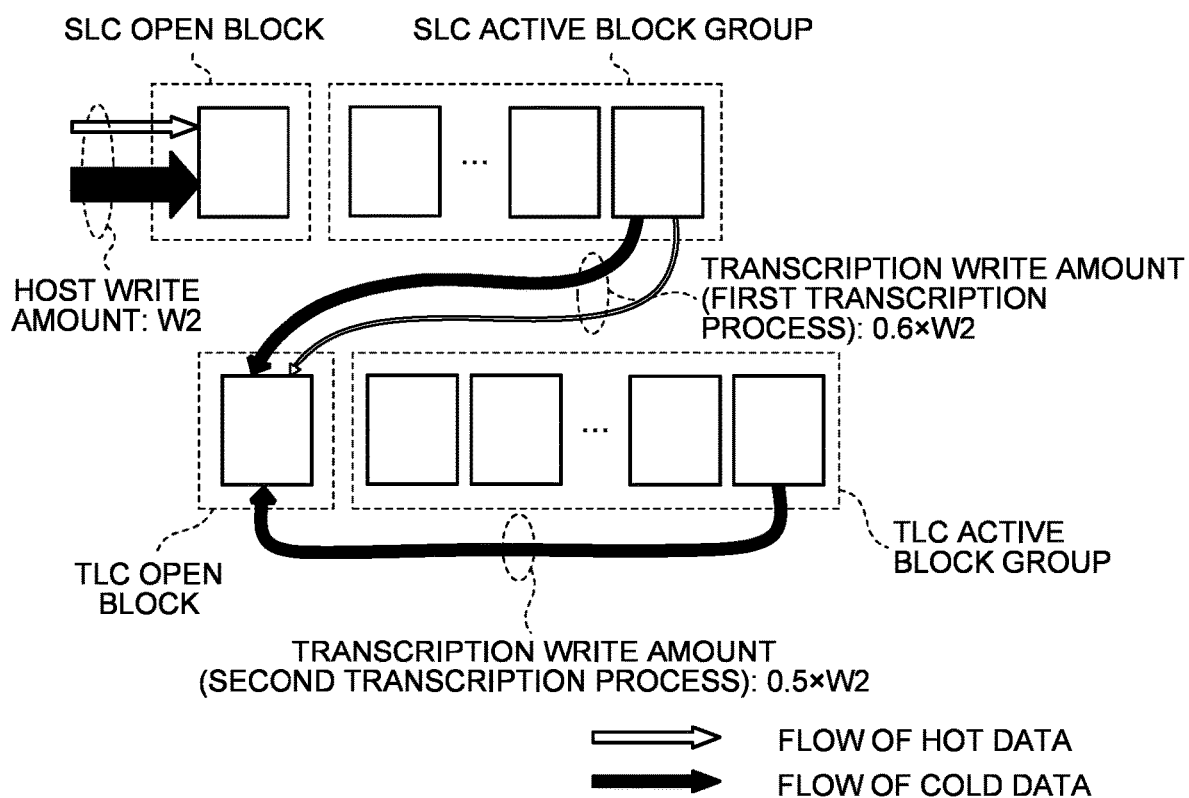
FIG. 15 is a schematic diagram for explaining an exemplary relationship between a host write amount and a transcription write amount in the memory system of the second embodiment when the proportion of cold data is relatively high.

FIG. 15 is a schematic diagram for explaining an exemplary relationship between a host write amount and a transcription write amount in the memory system 1 of the second embodiment when host data includes cold data at a relatively large proportion. FIG. 15 illustrates an SLC block group and a TLC block group included in the NAND memory 200. FIG. 15 omits illustrating an SLC free block and a TLC free block. The open arrows indicate a flow of hot data and the solid arrows indicate a flow of cold data.

According to the example illustrated in FIG. 15, when the host write amount is defined as W2, the transcription write amount by the first transcription process is found to be 0.6×W2 and the transcription write amount by the second transcription process is found to be 0.5×W2. Thus, the total transcription write amount is 1.1×W2, which is larger than the host write amount. In such a case, the processor 101 decreases the number of SLC blocks.

In the examples illustrated in FIGS. 14 and 15, the number of SLC blocks is increased when the transcription write amount is less than the host write amount, while the number of SLC blocks is decreased when the transcription write amount is more than the host write amount. The operation to be performed when the transcription write amount is equal to the host write amount can be freely set. With the transcription write amount matching the host write amount, the number of SLC blocks may be increased or decreased or may not be changed.

Further, the determination method for increasing or decreasing the number of SLC blocks is not limited to the above method based on a simple comparison between the transcription write amount and the host write amount. In order to prevent the number of SLC blocks from oscillating, the processor 101 may increase the number of SLC blocks when the transcription write amount is less than the host write amount and the difference between the transcription write amount and the host write amount is more than a constant C1 (where C1 is a positive real number). The processor 101 may decrease the number of SLC blocks when the transcription write amount is more than the host write amount and the difference between the transcription write amount and the host write amount is more than a constant C2 (where C2 is a positive real number). The constant C2 may be the same as or different from the constant C1. The operation to be performed when the transcription write amount is less than the host write amount and the difference between the transcription write amount and the host write amount is equal to the constant C1 can be freely set. The operation to be performed when the transcription write amount is more than the host write amount and the difference between the transcription write amount and the host write amount is equal to the constant C2 can be freely set. The constant C1 is an exemplary first value. The constant C2 is an exemplary second value.

Figure 16:
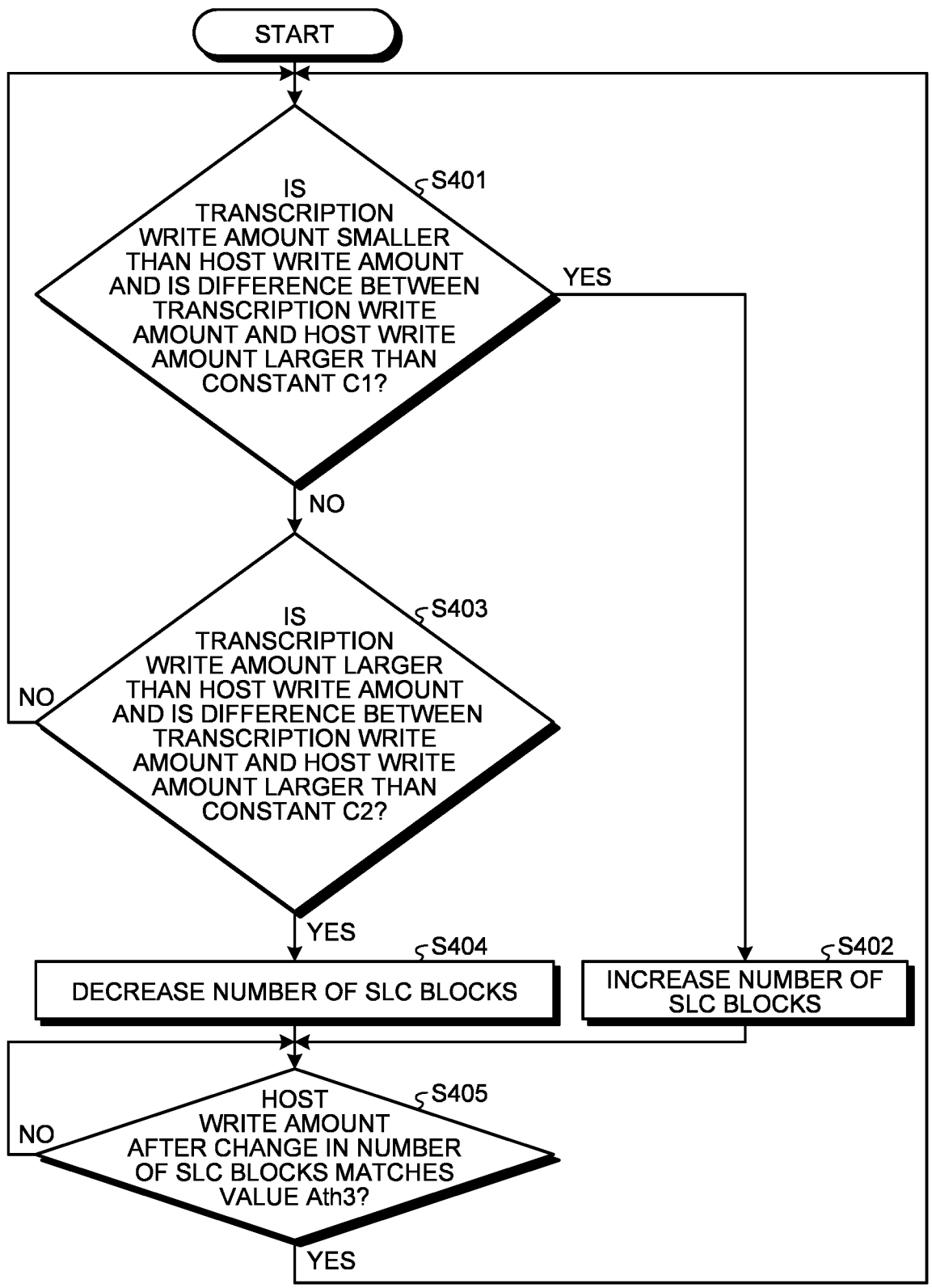
FIG. 16 is a flowchart illustrating a control method of the number of SLC blocks in the second embodiment.

FIG. 16 is a flowchart illustrating a control method of the number of SLC blocks in the second embodiment. FIG. 16 illustrates an example that the number of SLC blocks is controlled according to a result of comparison based on the constants C1 and C2.

The processor 101 monitors the host write amount and the transcription write amount. The processor 101 determines whether or not the transcription write amount is less than the host write amount and the difference between the transcription write amount and the host write amount is more than the constant C1 (S401). After determining that the transcription write amount is less than the host write amount and the difference between the transcription write amount and the host write amount is more than the constant C1 (S401: Yes), the processor 101 increases the number of SLC blocks by the same operation as in S303 of the first embodiment (S402).

When the transcription write amount is not less than the host write amount or the difference between the transcription write amount and the host write amount is not more than the constant C1 (S401: No), the processor 101 determines whether or not the transcription write amount is more than the host write amount and the difference between the transcription write amount and the host write amount is more than the constant C2 (S403). After determining that the transcription write amount is more than the host write amount and the difference between the transcription write amount and the host write amount is more than the constant C2 (S403: Yes), the processor 101 decreases the number of SLC blocks by the same operation as in S305 of the first embodiment (S404).

When the transcription write amount is not more than the host write amount or the difference between the transcription write amount and the host write amount is not more than the constant C2 (S403: No), the processor 101 executes the operation of S401.

After the operation of S402 or S404, the processor 101 determines whether or not the host write amount after the change in the number of SLC blocks matches a value Ath3 (S405), as in S306 of the first embodiment. After determining that the host write amount after the change in the number of SLC blocks does not match the value Ath3 (S405: No), the processor 101 makes the determination of S405 again. After determining that the host write amount after the change in the number of SLC blocks matches the value Ath3 (S405: Yes), the processor 101 executes the operation of S401.

According to the example illustrated in FIG. 16, the processor 101 makes the determination as to decreasing the number of SLC blocks (for example, the operation of S403) after making the determination as to increasing the number of SLC blocks (for example, the operation of S401). Alternatively, the processor 101 may make the determination as to decreasing the number of SLC blocks (for example, the operation of S403), and upon determining not to decrease the number of SLC blocks, the processor 101 may make the determination as to increasing the number of SLC blocks (for example, the operation of S401). Thus, the operations illustrated in FIG. 16 may be appropriately changed in order.

Further, the processor 101 may make a determination as to increasing the number of SLC blocks (for example, the operation of S401) and then make a determination as to decreasing the number of SLC blocks (for example, the operation of S403). Upon determining not to increase or decrease the number of SLC blocks, the processor 101 may postpone the determinations as to increasing and decreasing the number of SLC blocks for a certain period. The processor 101 may postpone a next determination until the host write amount matches the value Ath3 regardless of an increase or decrease in the number of SLC blocks.

According to the second embodiment as described above, the controller 100 controls the number of SLC blocks on the basis of a result of comparison between the host write amount and the transcription write amount.

Along with a change in the ratio of host data components, the relationship between the host write amount and the transcription write amount may change. Owing to the features as above, in response to a change in the ratio of host data components, the controller 100 can efficiently lower the execution frequency of the transcription process by appropriately changing the number of SLC blocks. Along with a decrease in the execution frequency of the transcription process, the memory system 1 can improve in terms of performance. Specifically, according to the second embodiment, the memory system 1 can control the number of bits of the value to be written per memory cell so as to enhance its performance as much as possible.

Further, according to the second embodiment, the controller 100 increases the number of SLC blocks when the transcription write amount is less than the host write amount, and decreases the number of SLC blocks when the transcription write amount is more than the host write amount, for example.

Thus, in response to a change in the ratio of host data components, the controller 100 can lower the execution frequency of the transcription process by appropriately changing the number of SLC blocks.

Further, according to the second embodiment, the controller 100 increases the number of SLC blocks when the transcription write amount is less than the host write amount and the difference between the transcription write amount and the host write amount is more than the constant C1, for example. The controller 100 decreases the number of SLC blocks when the transcription write amount is more than the host write amount and the difference between the transcription write amount and the host write amount is more than the constant C2.

Thus, in response to a change in the ratio of host data components, the controller 100 can lower the execution frequency of the transcription process by appropriately changing the number of SLC blocks. In addition, it is possible to prevent the number of SLC blocks from oscillating in a short period of time.

Further, according to the second embodiment the controller 100 postpones the determinations as to increasing and decreasing the number of SLC blocks after increasing or decreasing the number of SLC blocks, until the host write amount matches the value Ath3. Thereby, the controller 100 postpones controlling of the number of second blocks.

As such, it is made possible to postpone the controlling of the number of second blocks during a period not suitable for determining whether to increase the number of SLC blocks and decrease the number of SLC blocks.

While certain embodiments have been described, these embodiments have been presented by way of example only, and are not intended to limit the scope of the inventions. Indeed, the novel methods and systems described herein may be embodied in different other forms; furthermore, various omissions, substitutions and varies in the form of the methods and systems described herein may be made without departing from the spirit of the inventions. The accompanying claims and their equivalents are intended to cover such forms or modifications as would fall within the scope and spirit of the inventions.

What is claimed is:

1. A memory system connectable to a host device, the memory system comprising:
   a flash memory comprising a plurality of first blocks each of which includes a plurality of memory cells and to which data is writable in either of a first mode and a second mode, the first mode being a mode in which a value having a first number of bits is written per memory cell, the second mode being a mode in which a value having a second number of bits is written per memory cell, the second number being more than the first number; and
   a controller configured to:
   use a plurality of second blocks in the first mode, the plurality of second blocks being part of the plurality of first blocks,
   use a plurality of third blocks in the second mode, the plurality of third blocks being another part of the plurality of first blocks,
   sequentially write data from the host device to the plurality of second blocks, execute a first transcription process including selecting one second block from one or more second blocks in which data writing is completed among the plurality of second blocks, and placing the one second block into a reusable state by sequentially writing valid data from the one second block to the plurality of third blocks, execute a second transcription process including selecting one fourth block from a plurality of fourth blocks each being a third block in which data writing is completed among the plurality of third blocks, and placing the one fourth block into a reusable state by writing valid data from the one fourth block to a third block in which data writing is not completed, and increase a number of the second blocks in the plurality of first blocks when among the plurality of fourth blocks, a third number of fourth blocks in which data writing has been completed most recently include a fourth block storing a less amount of valid data than a first threshold value.

2. The memory system according to claim 1, wherein the fourth block storing the less amount of valid data than the first threshold value stores a minimum amount of valid data among the plurality of fourth blocks.

3. The memory system according to claim 1, wherein the controller is configured to postpone controlling of the number of the second blocks after increasing the number of the second blocks in the plurality of first blocks, until an amount of data written to the second blocks matches a first amount.

4. A memory system connectable to a host device, the memory system comprising:

a flash memory comprising a plurality of first blocks each of which includes a plurality of memory cells and to which data is writable in either of a first mode and a second mode, the first mode being a mode in which a value having a first number of bits is written per memory cell, the second mode being a mode in which a value having a second number of bits is written per memory cell, the second number being more than the first number, and a controller configured to:

use a plurality of second blocks in the first mode, the plurality of second blocks being part of the plurality of first blocks, use a plurality of third blocks in the second mode, the plurality of third blocks being another part of the plurality of first blocks, sequentially write data from the host device to the plurality of second blocks, execute a first transcription process including selecting one second block from one or more second blocks in which data writing is completed among the plurality of second blocks, and placing the one second block into a reusable state by sequentially writing valid data from the one second block to the plurality of third blocks, execute a second transcription process including selecting one fourth block from a plurality of fourth blocks each being a third block in which data writing is completed among the plurality of third blocks, and placing the one fourth block into a reusable state by writing valid data from the one fourth block to a third block in which data writing is not completed, and decrease a number of second blocks in the plurality of first blocks when among the plurality of fourth blocks, a fourth number of fourth blocks in which data writing has been completed most previously include a fourth block storing a more amount of valid data than a second threshold value.

5. The memory system according to claim 4, wherein the fourth number is one.

6. The memory system according to claim 4, wherein the controller is configured to postpone controlling of the number of the second blocks after decreasing the number of the second blocks in the plurality of first blocks, until an amount of data written to the second blocks matches a first amount.

7. A memory system connectable to a host device, the memory system comprising:

a flash memory comprising a plurality of first blocks each of which includes a plurality of memory cells and to which data is writable in either of a first mode and a second mode, the first mode being a mode in which a value having a first number of bits is written per memory cell, the second mode being a mode in which a value having a second number of bits is written per memory cell, the second number being more than the first number; and a controller configured to:

use a plurality of second blocks in the first mode, the plurality of second blocks being part of the plurality of first blocks, use a plurality of third blocks in the second mode, the plurality of third blocks being another part of the plurality of first blocks, sequentially write data from the host device to the plurality of second blocks, execute a first transcription process including selecting one second block from one or more second blocks in which data writing is completed among the plurality of second blocks, and placing the one second block into a reusable state by sequentially writing valid data from the one second block to the plurality of third blocks, execute a second transcription process including selecting one fourth block from a plurality of fourth blocks each being a third block in which data writing is completed among the plurality of third blocks, and placing the one fourth block into a reusable state by writing valid data from the one fourth block to a third block in which data writing is not completed, increase a number of the second blocks in the plurality of first blocks when a second data amount is less than a first data amount, the first data amount being an amount of data written to the plurality of second blocks per unit time, the second data amount being an amount of data written to the plurality of third blocks per the unit time, and decrease the number of the second blocks in the plurality of first blocks when the second data amount is more than the first data amount.

8. The memory system according to claim 7, wherein the controller is configured to increase the number of the second blocks in the plurality of first blocks when a difference between the second data amount and the first data amount is more than a first value.

9. The memory system according to claim 7, wherein the controller is configured to postpone controlling of the number of the second blocks after increasing or decreasing the number of the second blocks in the plurality of first blocks, until an amount of data written to the plurality of second blocks matches a first amount.

10. The memory system according to claim 7, wherein the controller is configured to decrease the number of the second blocks in the plurality of first blocks when the difference between the second data amount and the first data amount is more than a second value.

\* \* \* \* \*